(12) United States Patent
Kobayashi et al.

(10) Patent No.: US 7,923,843 B2
(45) Date of Patent: Apr. 12, 2011

(54) SEMICONDUCTOR DEVICE WITH A CONTACT PLUG CONNECTED TO MULTIPLE INTERCONNECTS FORMED WITHIN

(75) Inventors: Michihiro Kobayashi, Kanagawa (JP); Hirofumi Nikaido, Kanagawa (JP); Nobuyuki Katsuki, Kanagawa (JP); Yasuhiro Kawakatsu, Kanagawa (JP)

(73) Assignee: NEC Electronics Corporation, Kawasaki, Kanagawa (JP)

( * ) Notice: Subject to any disclaimer, the term of this patent is extended or adjusted under 35 U.S.C. 154(b) by 309 days.

(21) Appl. No.: 11/806,231

(22) Filed: May 30, 2007

(65) Prior Publication Data
US 2007/0278694 A1    Dec. 6, 2007

(30) Foreign Application Priority Data

May 31, 2006    (JP) .................................. 2006-152104

(51) Int. Cl.
*H01L 23/48*    (2006.01)
(52) U.S. Cl. ................. 257/774; 257/775; 257/E23.145
(58) Field of Classification Search .................. 257/774, 257/775, E21.59, E21.661, E23.142, E23.145, 257/E27.098
See application file for complete search history.

(56) References Cited

U.S. PATENT DOCUMENTS

| | | | |
|---|---|---|---|
| 5,600,170 A | 2/1997 | Sugiyama et al. | |
| 6,291,305 B1 | 9/2001 | Huang et al. | |
| 6,495,874 B1 | 12/2002 | Kawamura et al. | |
| 6,657,247 B2 | 12/2003 | Yoshiyama et al. | |
| 6,661,095 B2 | 12/2003 | Ukita | |
| 2002/0173096 A1* | 11/2002 | Okudaira | 438/253 |
| 2003/0205738 A1* | 11/2003 | Kanaya et al. | 257/200 |

FOREIGN PATENT DOCUMENTS

| | | |
|---|---|---|
| JP | 8-181205 | 7/1996 |
| JP | 2000-164812 | 6/2000 |
| JP | 2002-33389 A | 1/2002 |
| JP | 2002-353328 | 12/2002 |
| JP | 2003-243522 | 8/2003 |
| JP | 2006-19371 A | 1/2006 |

OTHER PUBLICATIONS

Chinese Office Action dated Jun. 12, 2009 (with partial English translation).

* cited by examiner

*Primary Examiner* — Lynne A Gurley
*Assistant Examiner* — Vernon P Webb
(74) *Attorney, Agent, or Firm* — McGinn IP Law Group, PLLC

(57) ABSTRACT

Two interconnect layers are electrically connected while reducing the number of manufacturing steps. A contact plug 9c which is formed into a beaded shape in a layer underlying two interconnects 11C and 11D and which also electrically connects the two interconnects 11C and 11D is included. The two interconnects 11C and 11D are separated to each other and are formed in a same layer. The contact plug 9c is simultaneously formed with a contact plug 9b to be connected to an interconnect 4b and a contact plug 9a to be connected to a source/drain region 6.

5 Claims, 22 Drawing Sheets

FIG. 1A (FIRST EXAMPLE)
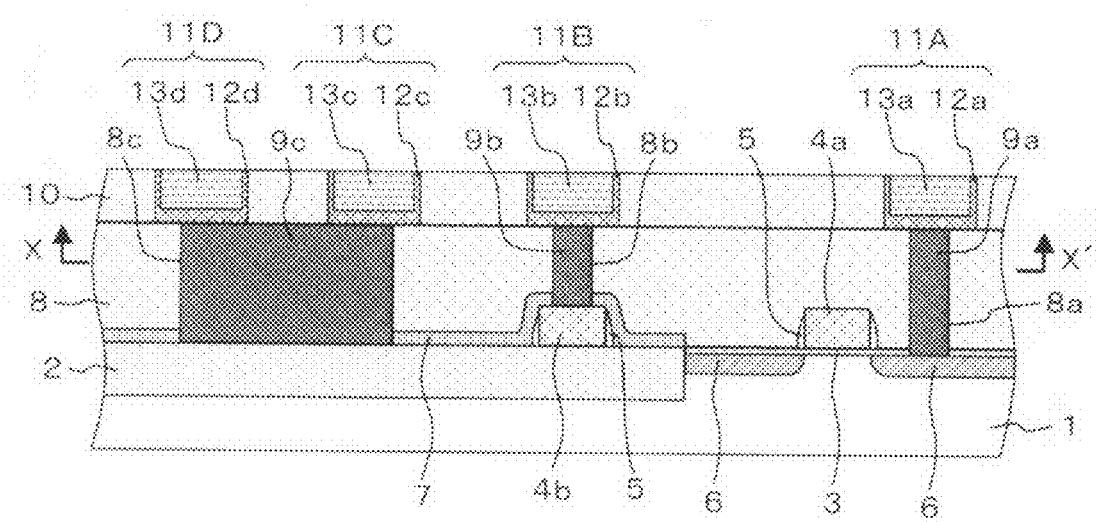
FIG. 1B (FIRST EXAMPLE)
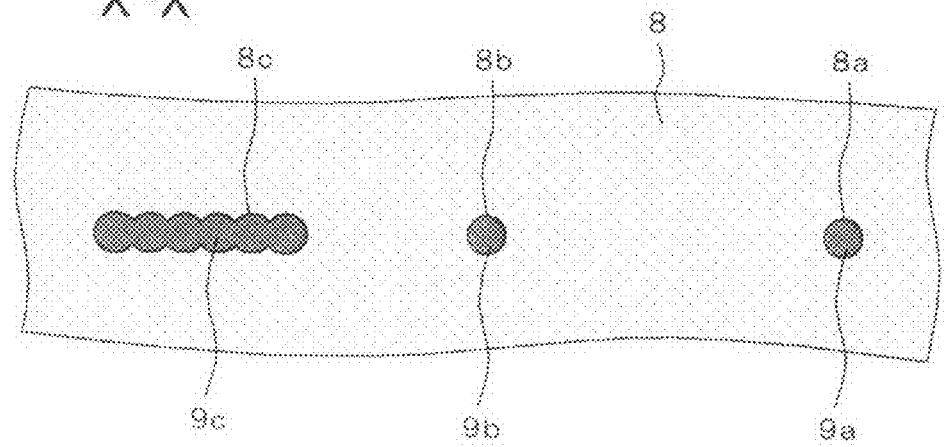

(FIRST EXAMPLE)

(FIRST EXAMPLE)

(FIRST EXAMPLE)

FIG. 3A (FIRST EXAMPLE)
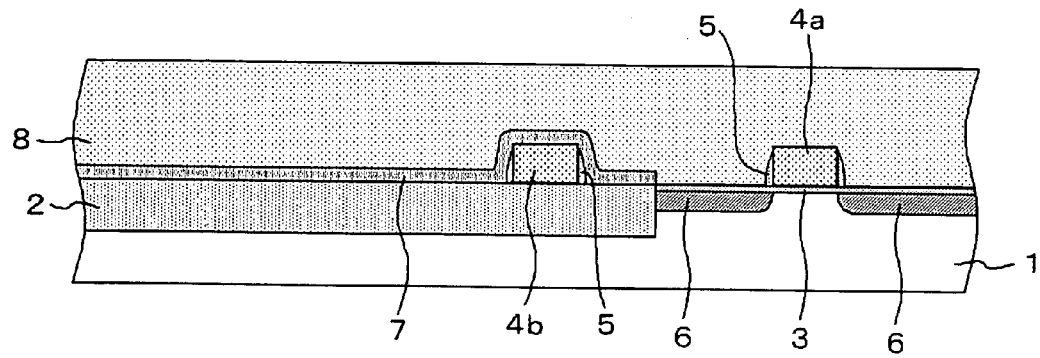
FIG. 3B (FIRST EXAMPLE)
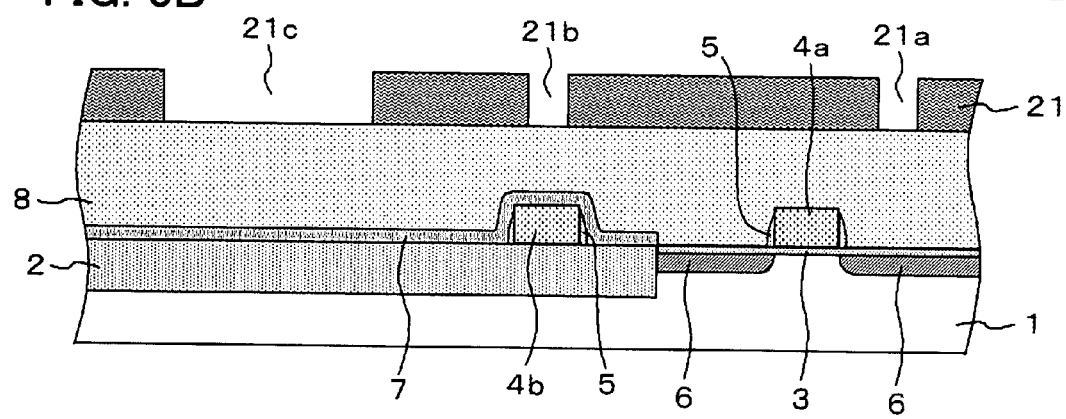
FIG. 3C (FIRST EXAMPLE)
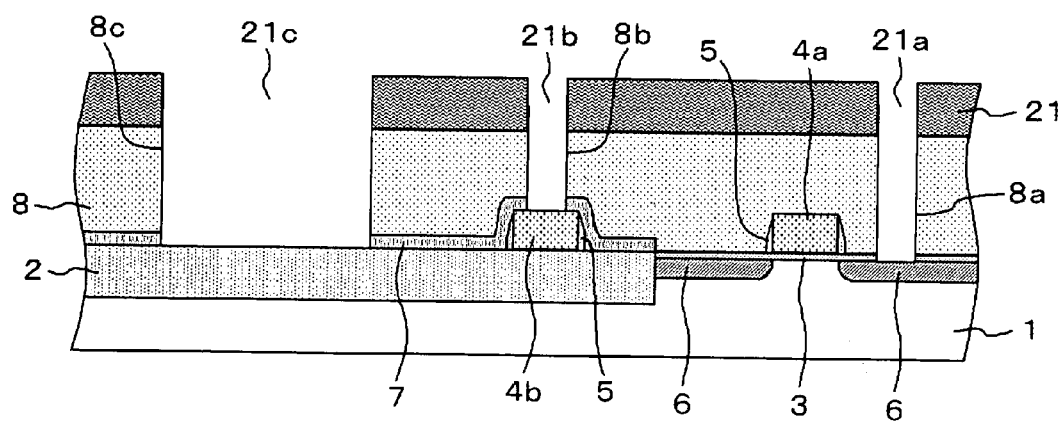

FIG. 4A (FIRST EXAMPLE)
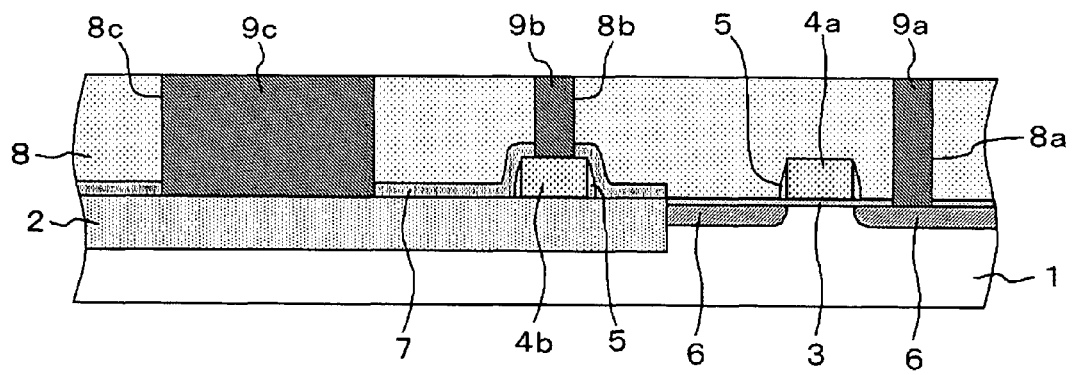
FIG. 4B (FIRST EXAMPLE)
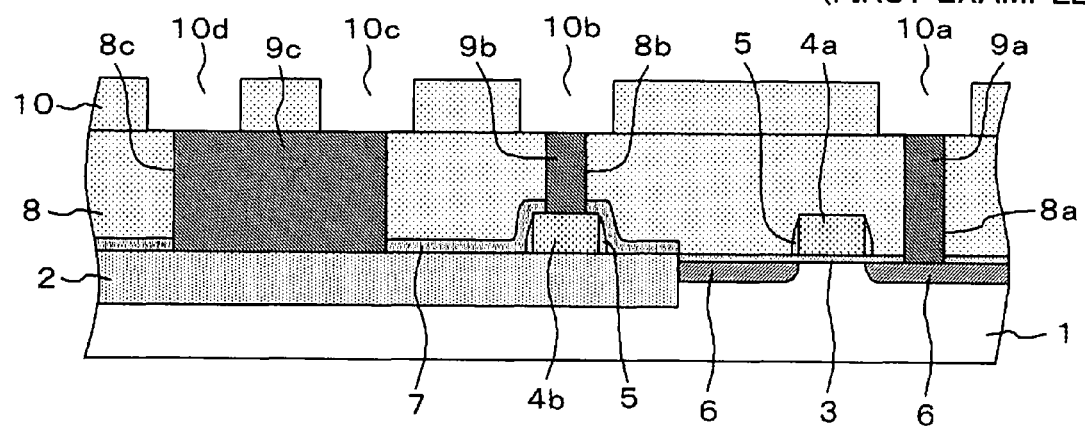
FIG. 4C (FIRST EXAMPLE)
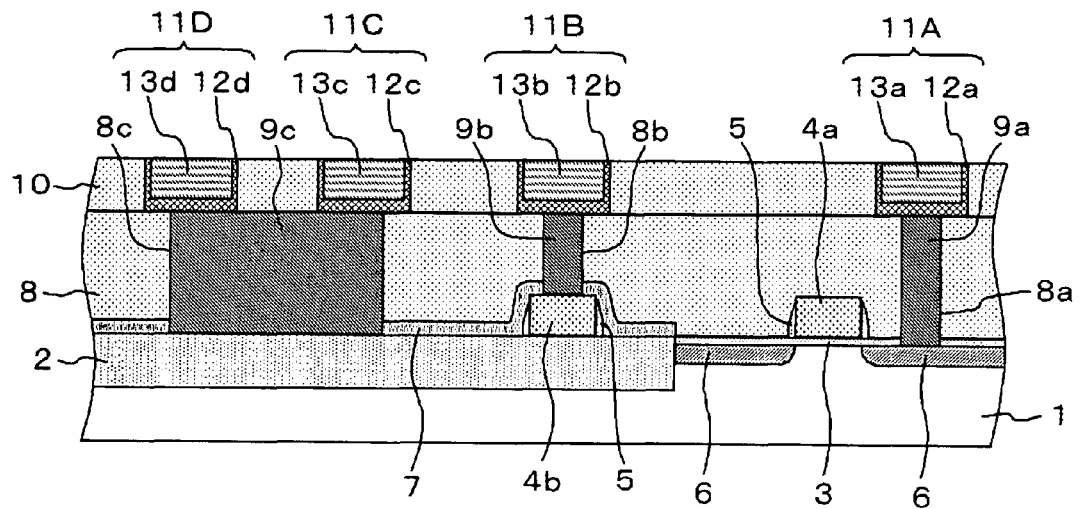

FIG. 5 (FIRST EXAMPLE)
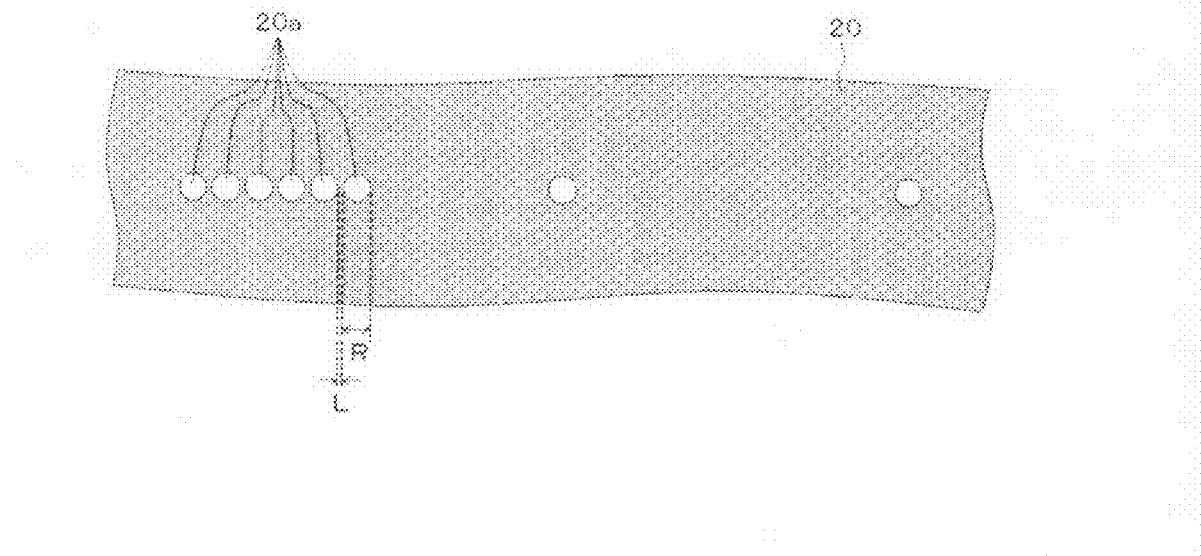
FIG. 6 (FIRST EXAMPLE)
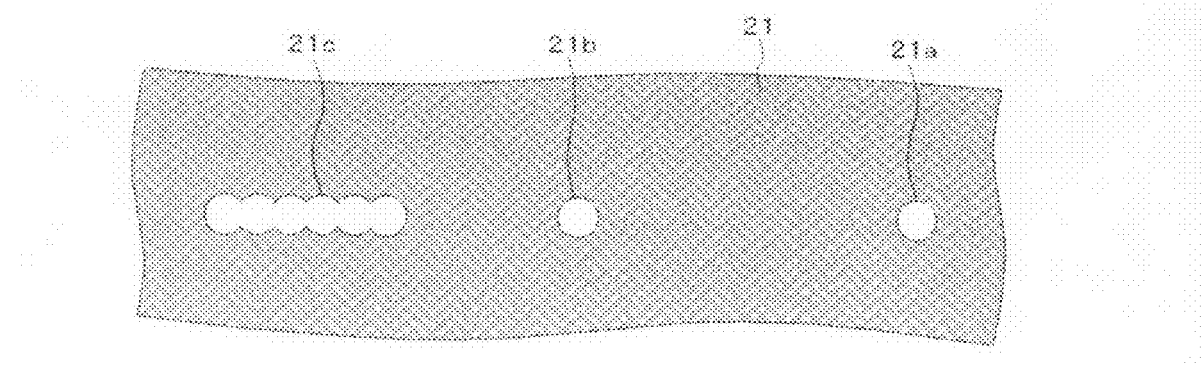

FIG. 7A (SECOND EXAMPLE)
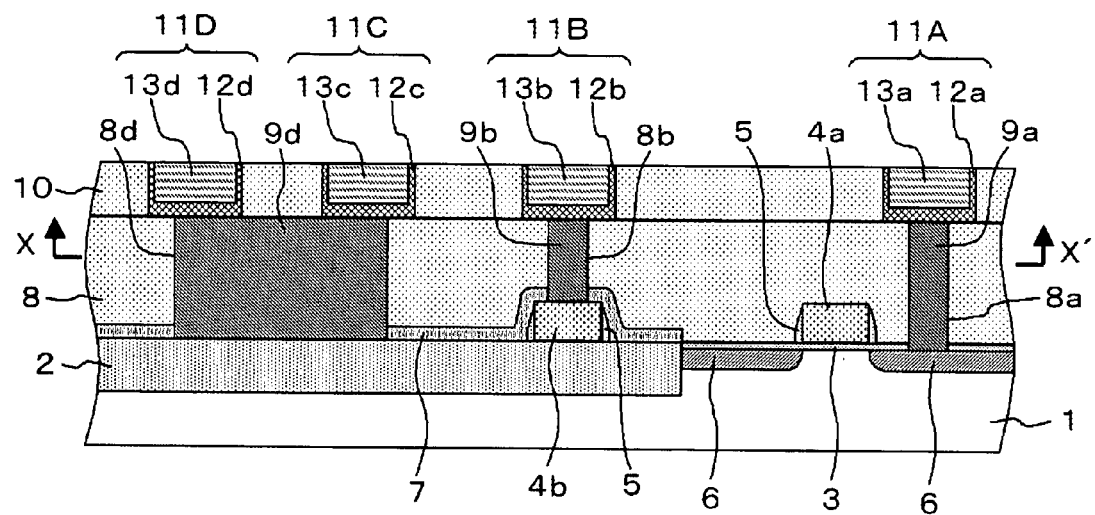
FIG. 7B (SECOND EXAMPLE)
X-X'
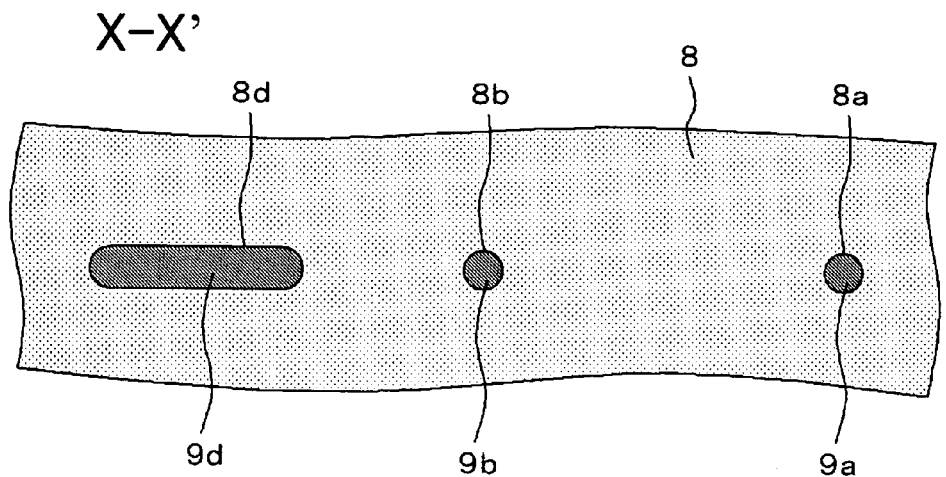

(SECOND EXAMPLE)

(THIRD EXAMPLE)

(THIRD EXAMPLE)

X-X'

FIG. 10A (THIRD EXAMPLE)
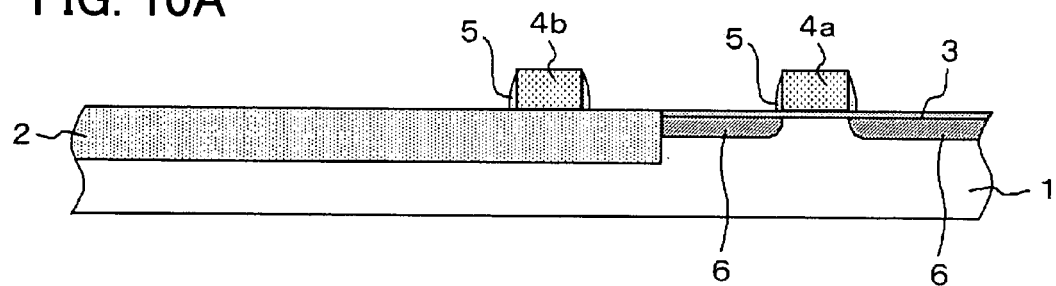
FIG. 10B (THIRD EXAMPLE)
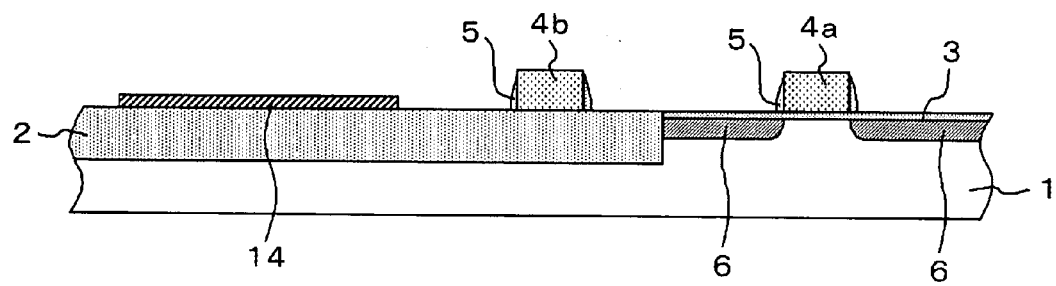
FIG. 10C (THIRD EXAMPLE)
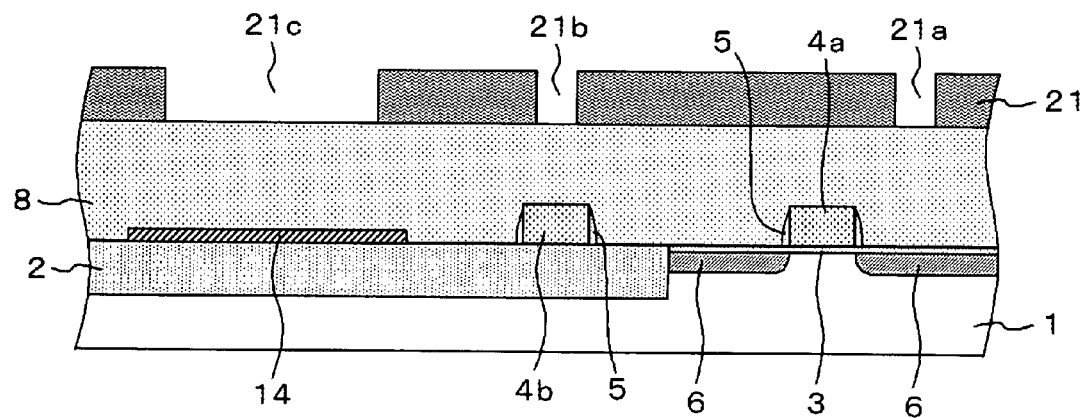

FIG. 11A (THIRD EXAMPLE)
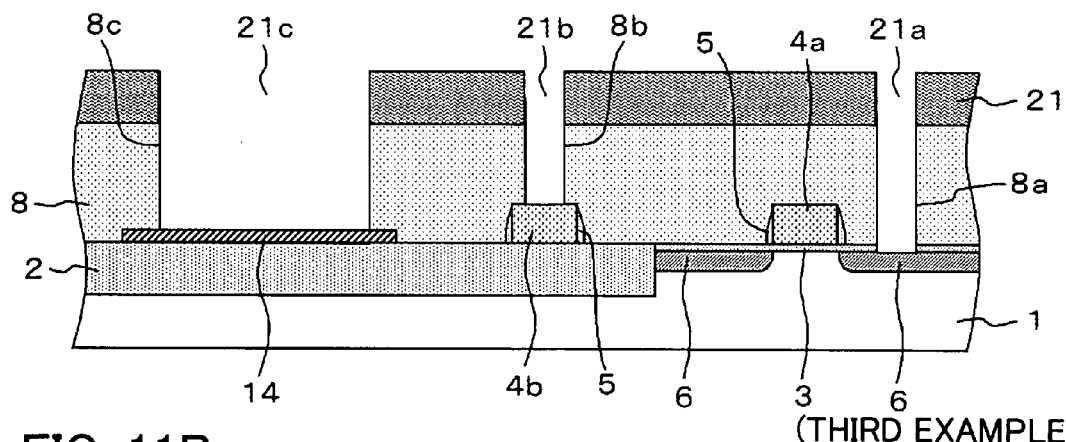
FIG. 11B (THIRD EXAMPLE)
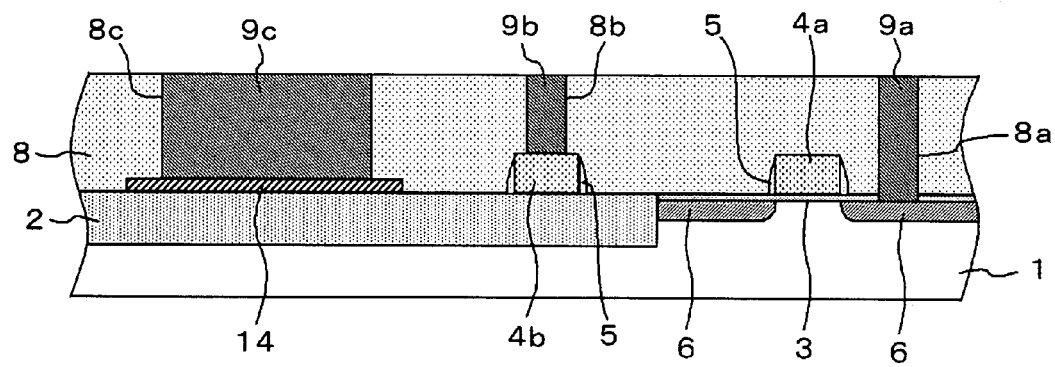
FIG. 11C (THIRD EXAMPLE)
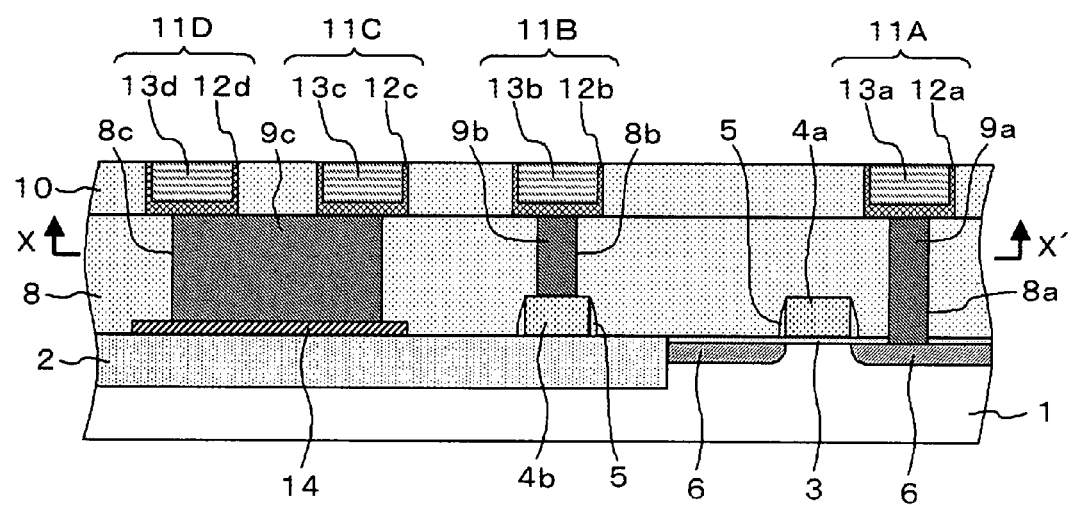

(FOURTH EXAMPLE)

(FIFTH EXAMPLE)

(SIXTH EXAMPLE)

X-X'

(SEVENTH EXAMPLE)

(EIGHTH EXAMPLE)

(NINTH EXAMPLE)

SEMICONDUCTOR DEVICE WITH A CONTACT PLUG CONNECTED TO MULTIPLE INTERCONNECTS FORMED WITHIN

REFERENCE TO RELATED APPLICATIONS

The present application is claiming the priority of the earlier Japanese patent application No. 2006-152104 filed on May 31, 2006, the entire disclosure thereof being incorporated herein by reference thereto.

FIELD OF THE INVENTION

The present invention relates to a semiconductor device including wiring layers and contact plugs, and a manufacturing method of the semiconductor device.

BACKGROUND OF THE INVENTION

There are some conventional semiconductor devices in which two wiring layers in an upper layer are connected via an wiring layer in a lower layer and contact plugs (refer to Patent Documents 1 and 2, for example). Referring to Patent Document 1, a lower electrode 130c connected to a contact plug is electrically connected to an interconnect 123c formed of a polysilicon film via an opening 127c, and is then electrically connected to an interconnect 133c via a contact plug 130d (refer to FIG. 20). Referring to Patent Document 2, an interconnect 206a is electrically connected to an interconnect 206b via a contact plug 204a, a high-resistance element layer 211, and a contact plug 204b (refer to FIG. 21).

[Patent Document 1] JP Patent Kokai Publication No. JP-P2000-164812A

[Patent Document 2] JP Patent Kokai Publication No. JP-P2003-243522A

[Patent Document 3] JP Patent Kokai Publication No. JP-A-8-181205

[Patent Document 4] JP Patent Kokai Publication No. JP-P2002-353328A

SUMMARY OF THE DISCLOSURE

The following analysis is given by the present invention. The entire disclosures of the above mentioned Patent Documents are herein incorporated by reference thereto.

In a wiring structure in Patent Document 1, the lower electrode 130c, interconnect 133c, contact plug 130d, and interconnect 123c are required. Accordingly, there is a problem that the number of manufacturing steps is large in order to form these wiring elements.

When the interconnect 123c formed of the polysilicon film in Patent Document 1 and the high-resistance element layer 211 formed of polysilicon in Patent Document 2 are employed for an interconnect in a lower layer that connects two contact plugs, a drawback arises that wiring resistance is increased.

It is an object of the present invention to electrically connect two wiring layers while reducing the number of manufacturing steps.

According to a first aspect of the present invention, there is provided a semiconductor device comprising: a contact plug formed into a beaded shape or a slit shape in a layer underlying each of two interconnects, the contact plug electrically connecting the two interconnects.

According to a second aspect of the present invention, there is provided a semiconductor device comprising: a first region with SRAM cells formed on a substrate thereof; a power supply hanging portion provided for a predetermined number of the SRAM cells; a second region between the first region and the power supply hanging portion; and an embedded interconnect being continuous from the first region to the power supply hanging portion; the first region, the second region and the supply power hanging portion being continuous in a direction horizontal to the substrate.

According to a third aspect of the present invention, there is provided a method for manufacturing a semiconductor device. The method comprises the steps of: applying a resist on an interlayer insulating film, and then performing exposure and development using a reticle having three or more contact patterns, thereby forming a pattern portion of a beaded shape or a slit shape in the resist, the contact patterns being arranged at a pitch width narrower than a diameter of a circular contact hole; forming an opening of the beaded shape or the slit shape in at least the interlayer insulating film, using the resist as a mask; forming a contact plug of the beaded shape or the slit shape in the opening; and forming two interconnects separated from each other on the interlayer insulating film including the contact plug.

The meritorious effects of the present invention are summarized as follows.

According to the present invention, the two interconnects (wiring elements) are electrically connected. It is therefore enough to form just two structures of the two interconnects and the contact plug among wiring elements. Accordingly, the number of manufacturing steps is reduced more than in conventional manufacturing methods and a layout which has an optimal wiring structure in a layer overlaying the contact plugs can be implemented. Since the contact plug with the beaded shape is formed simultaneously with contact plugs to be connected to other wires and devices, there is an advantage that electrical connection between the interconnects can be made with a lower resistance than in a conventional art.

BRIEF DESCRIPTIONS OF THE DRAWINGS

FIGS. 1A and 1B are a partial sectional view and a sectional view taken along a line X-X', respectively, which schematically show a configuration of a semiconductor device according to a first example of the present invention;

Figure 8:
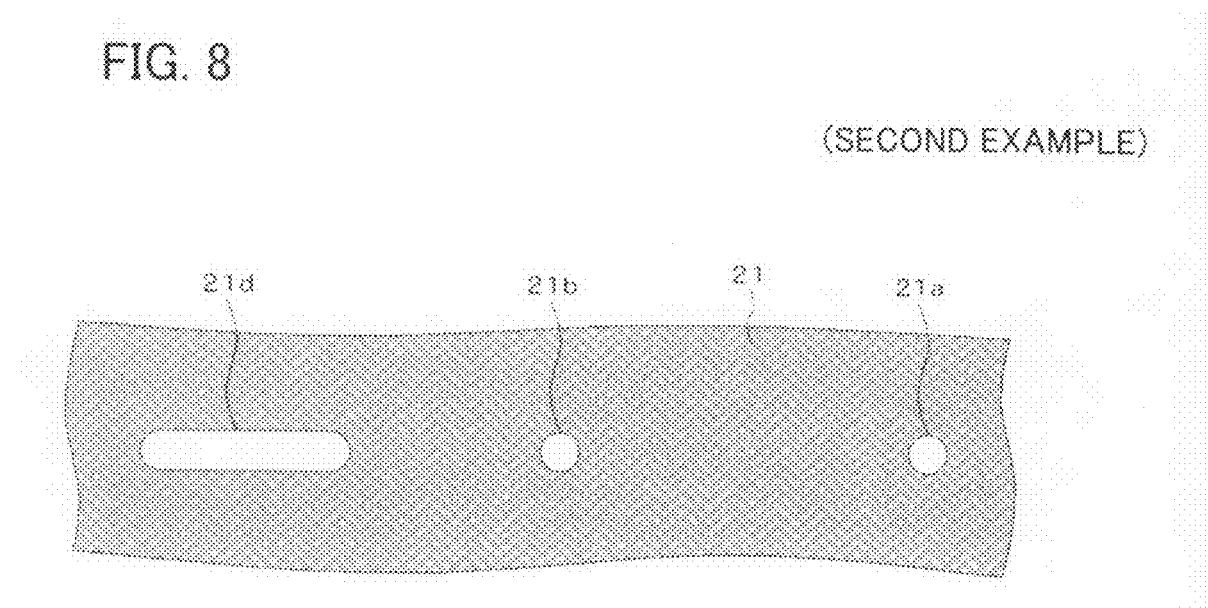
Figure 9A:
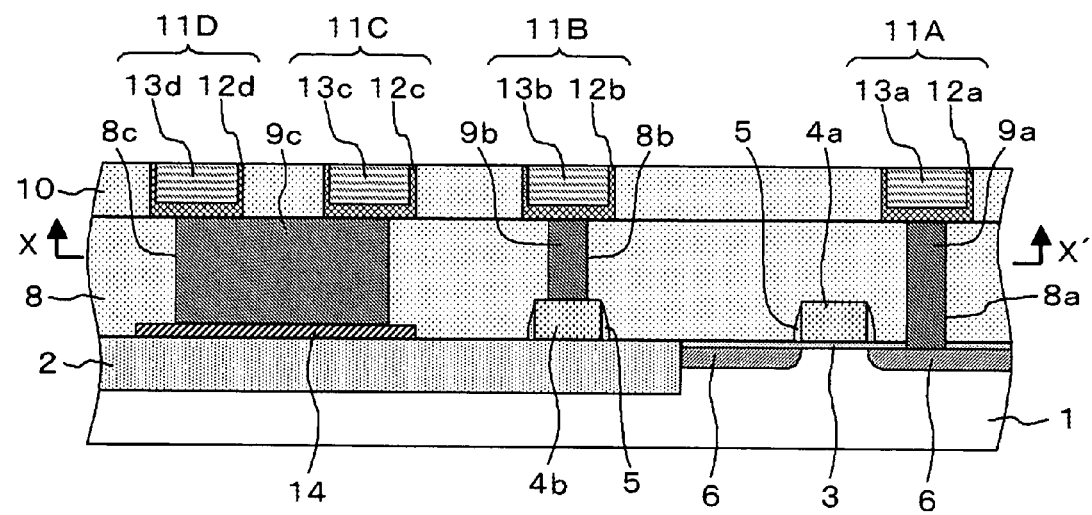
Figure 9B:
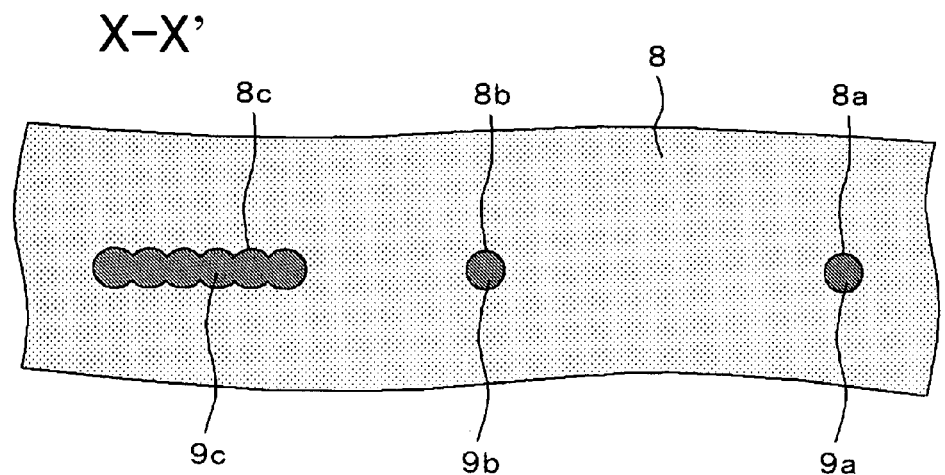
Figure 12A:
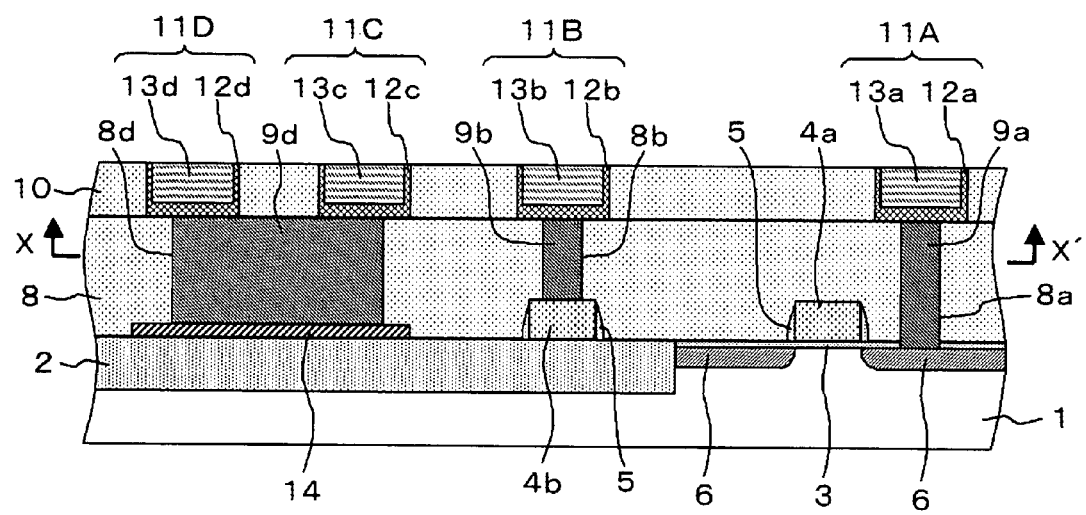
Figure 12B:
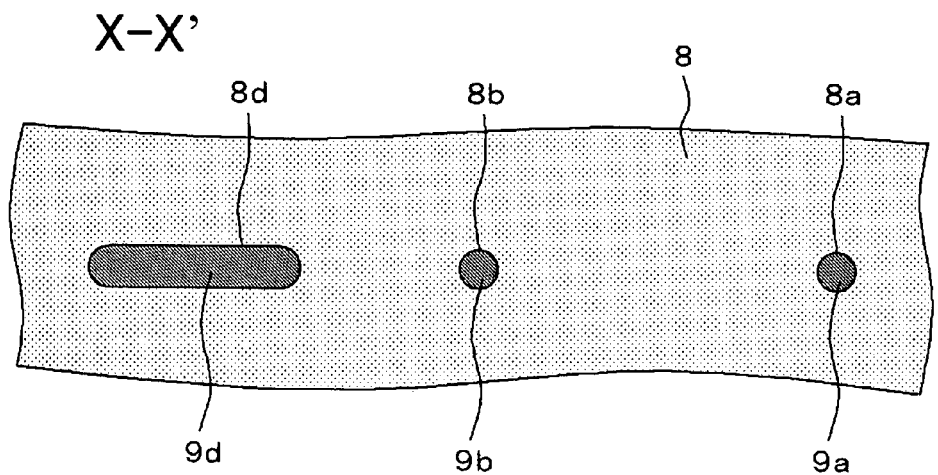
Figure 13A:
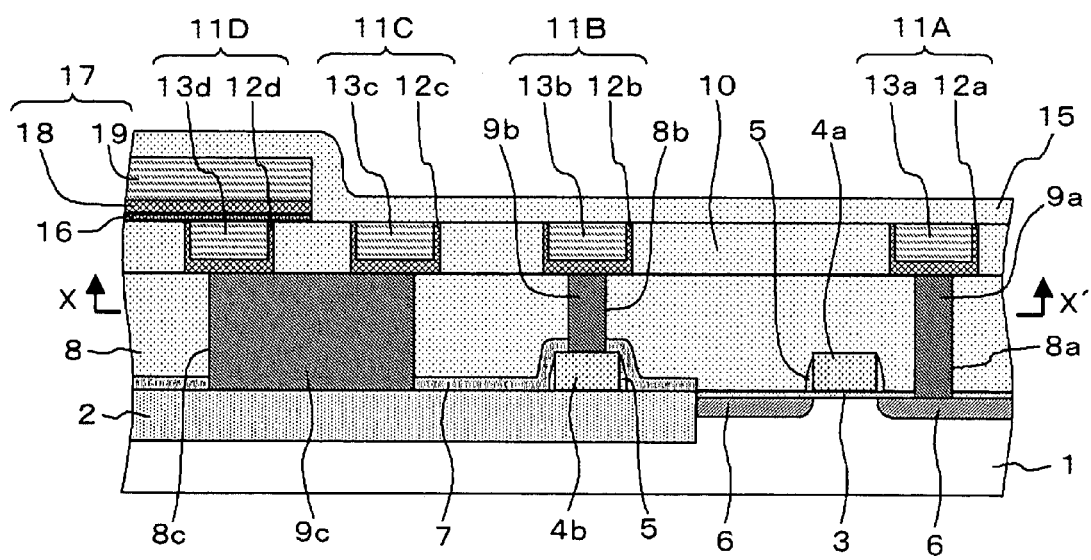
Figure 13B:
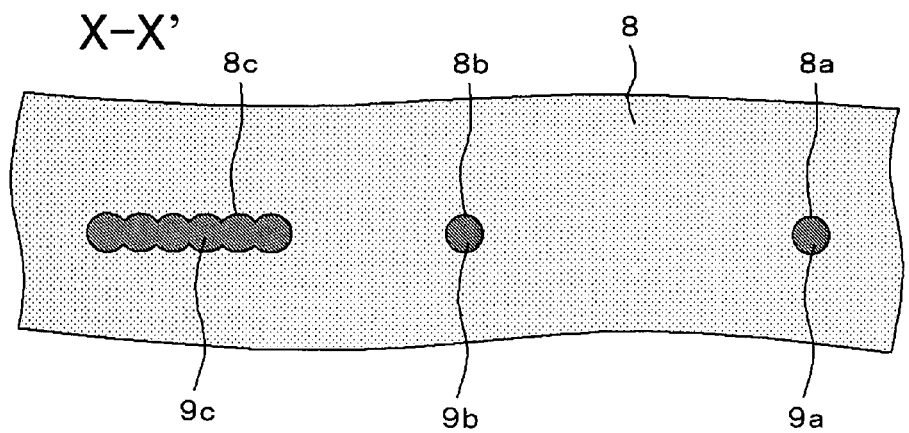
Figure 14A:
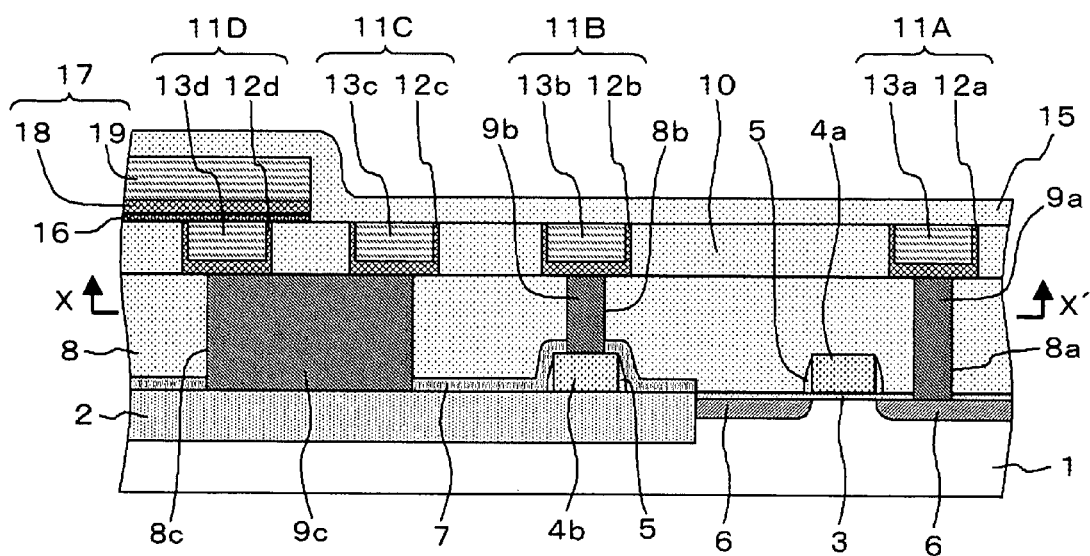
Figure 14B:
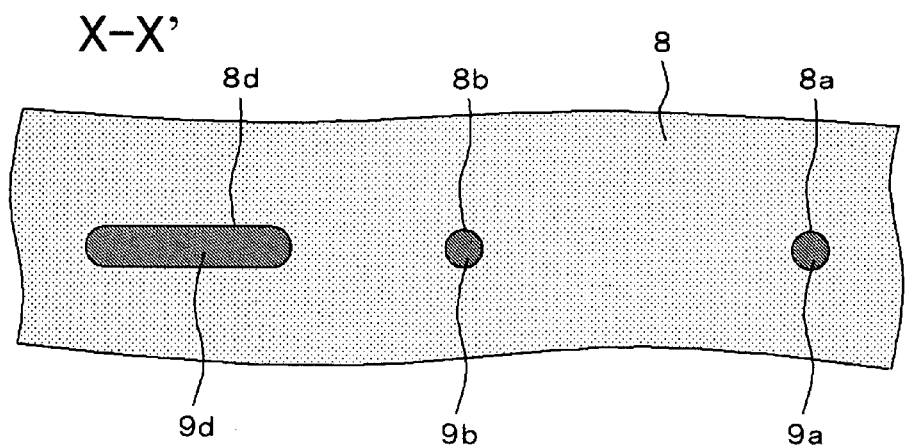
Figure 15A:
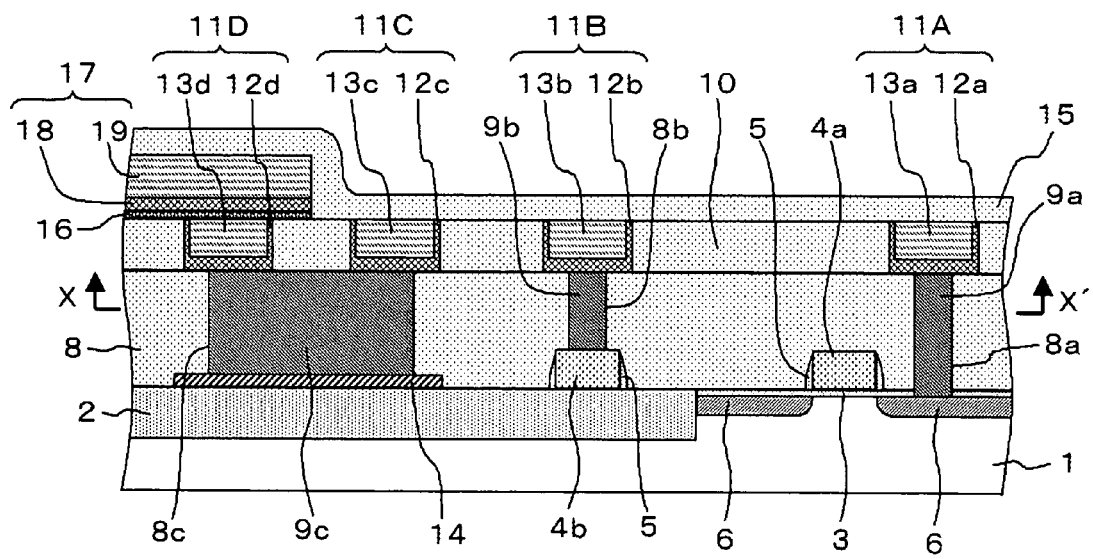
Figure 15B:
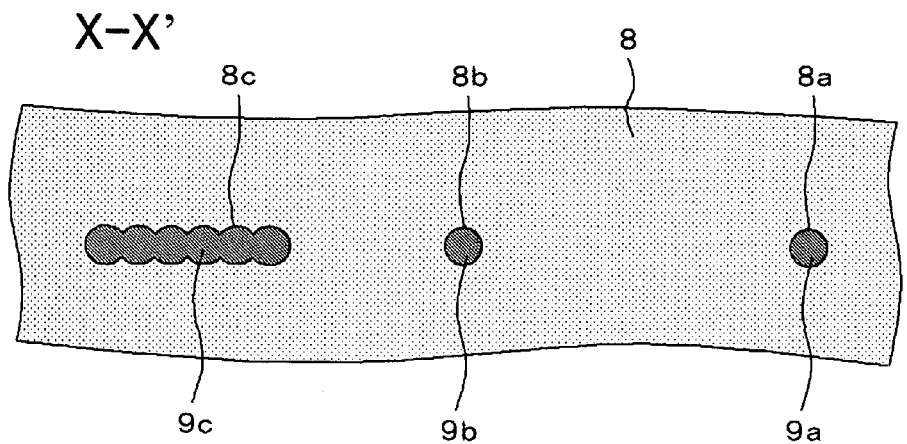
Figure 16A:
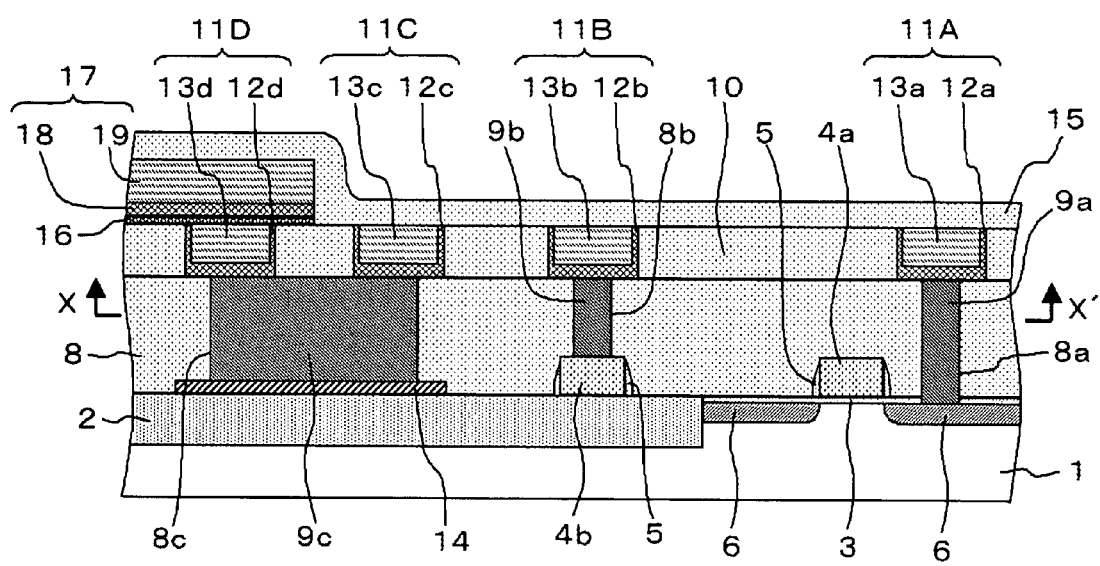
Figure 16B:
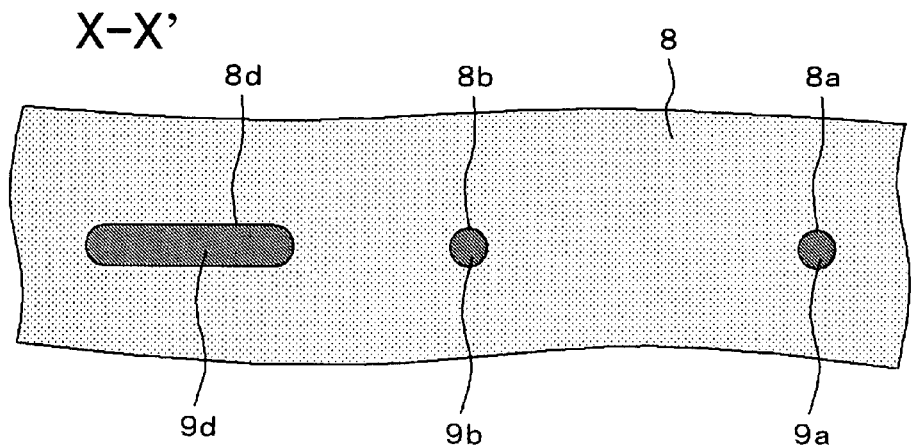
Figure 17:
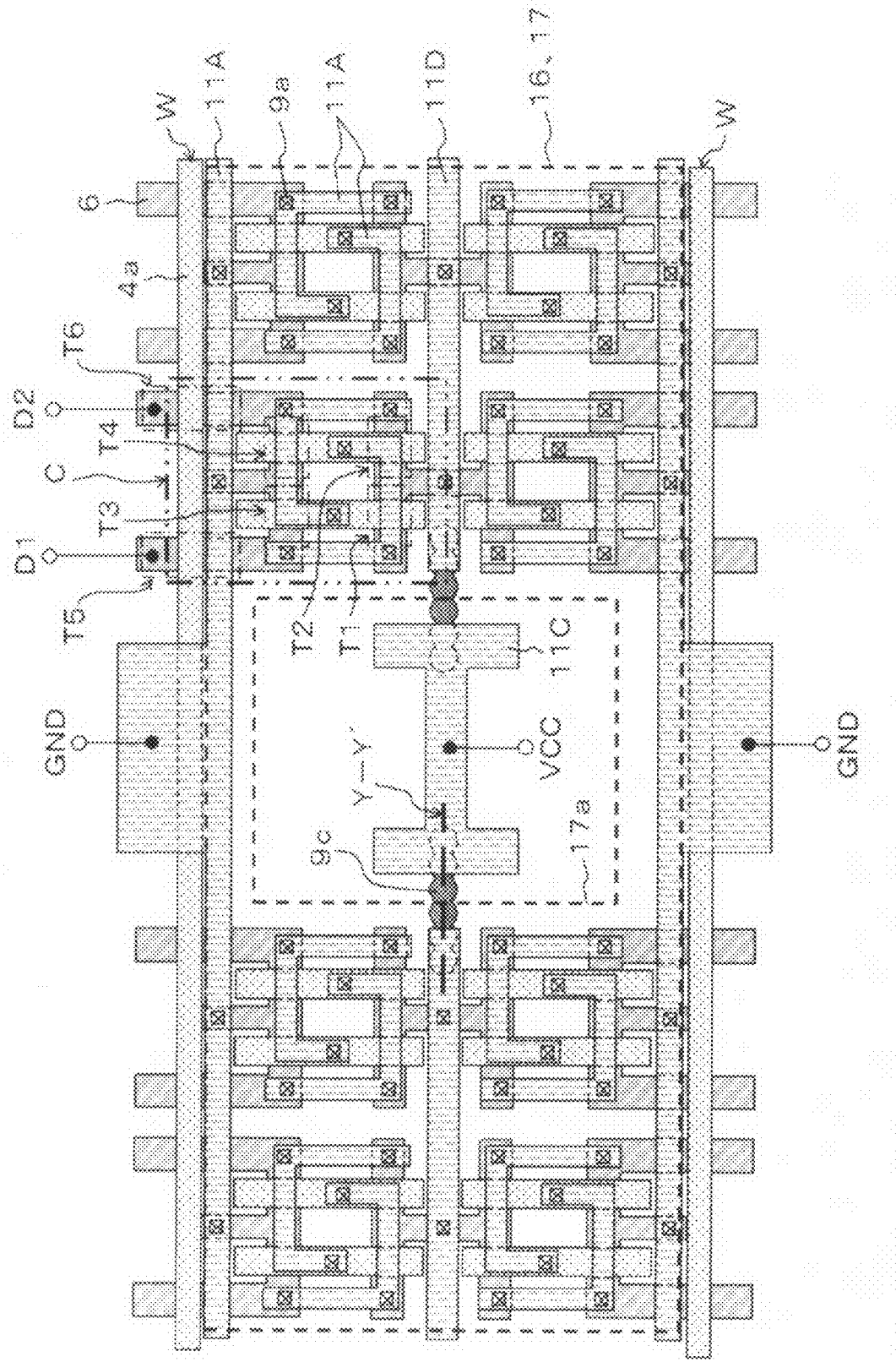
Figure 18:
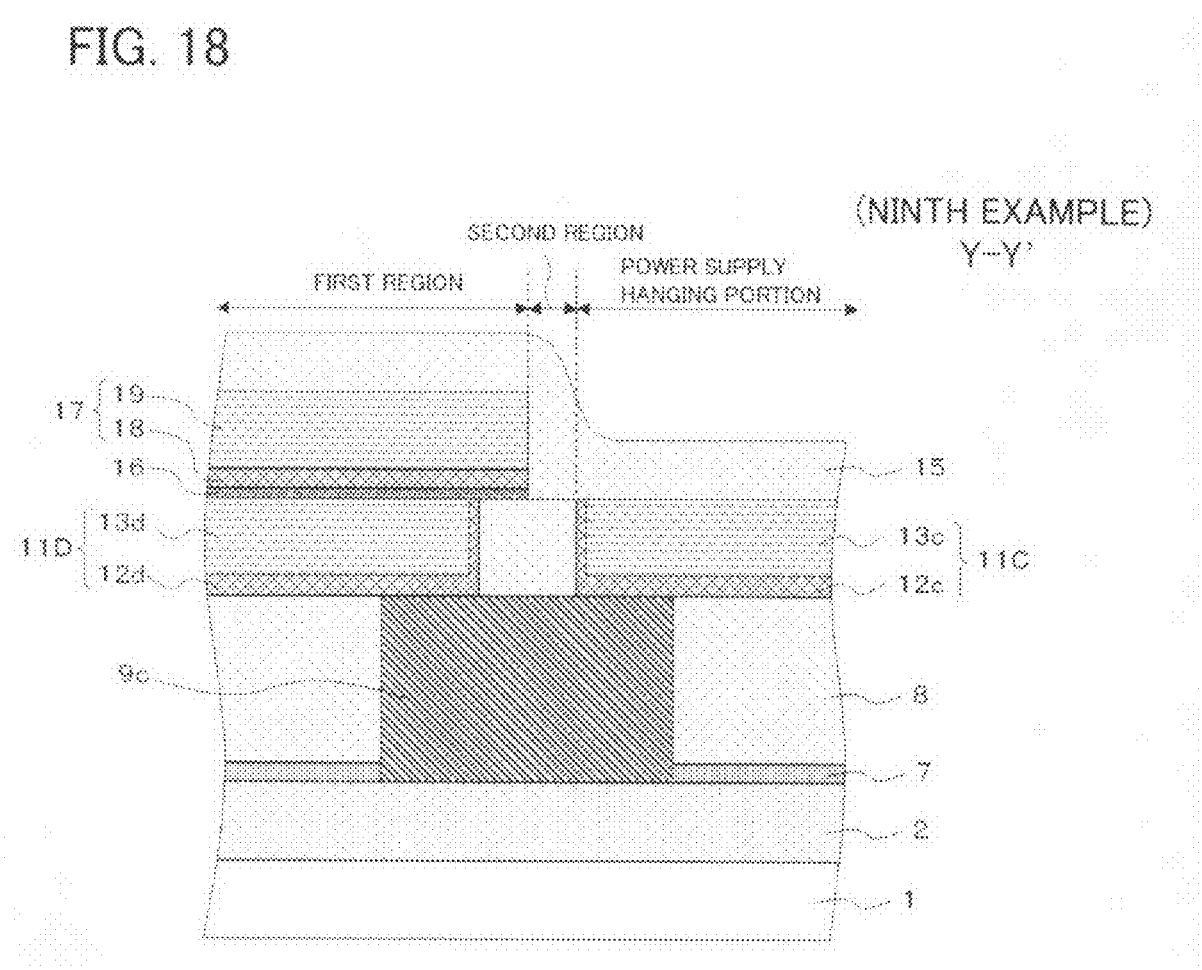
Figure 19:
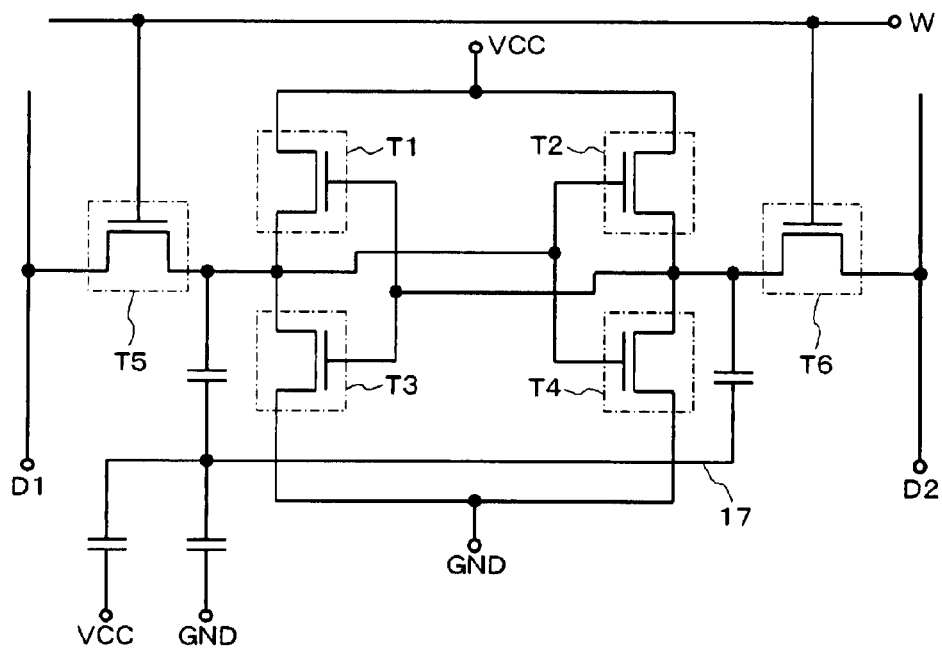
Figure 20:
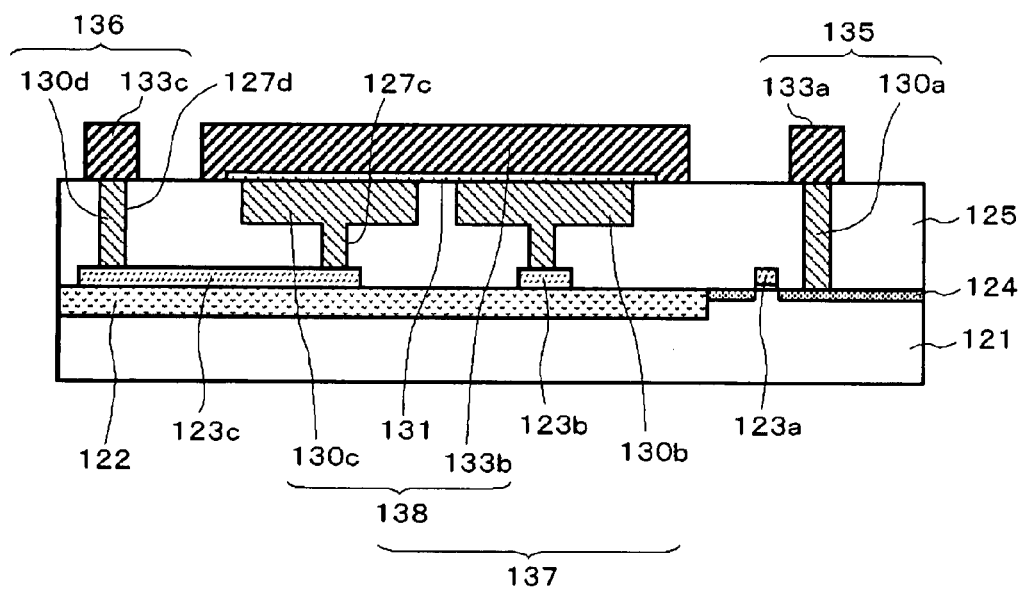
Figure 21:
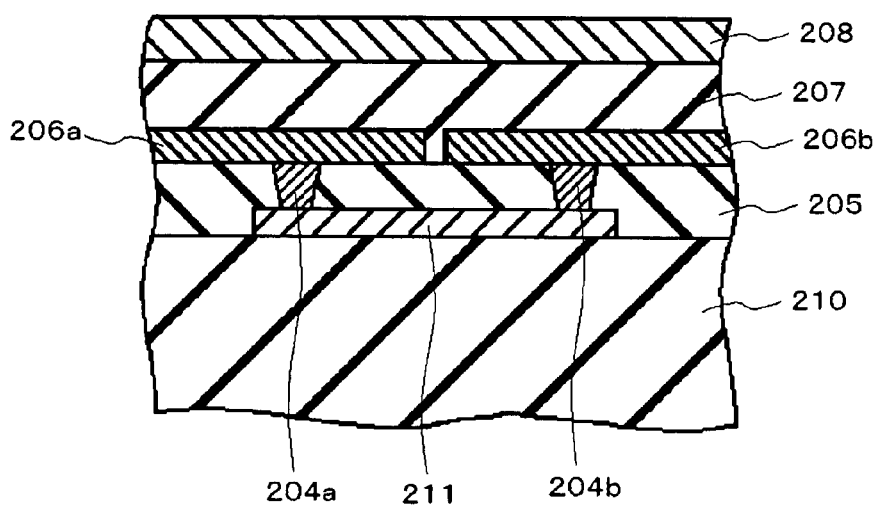
Figure 22:
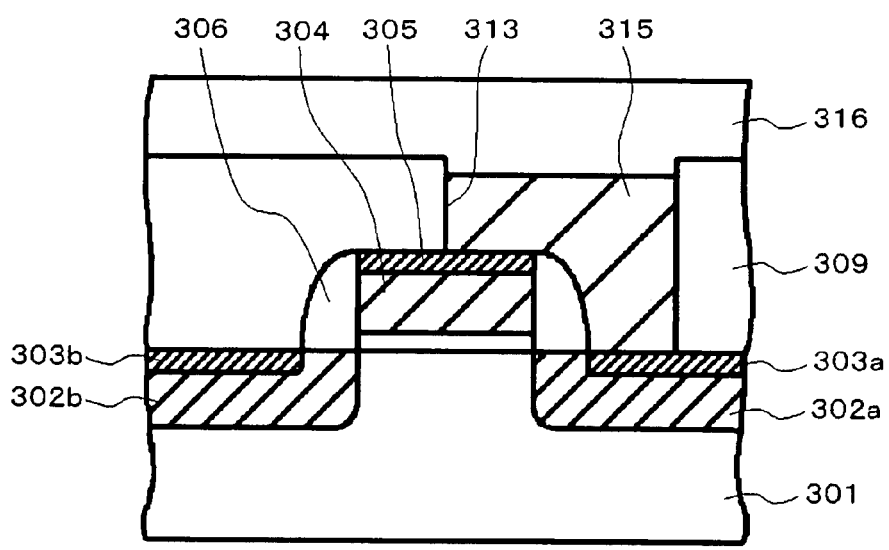
Figure 23:
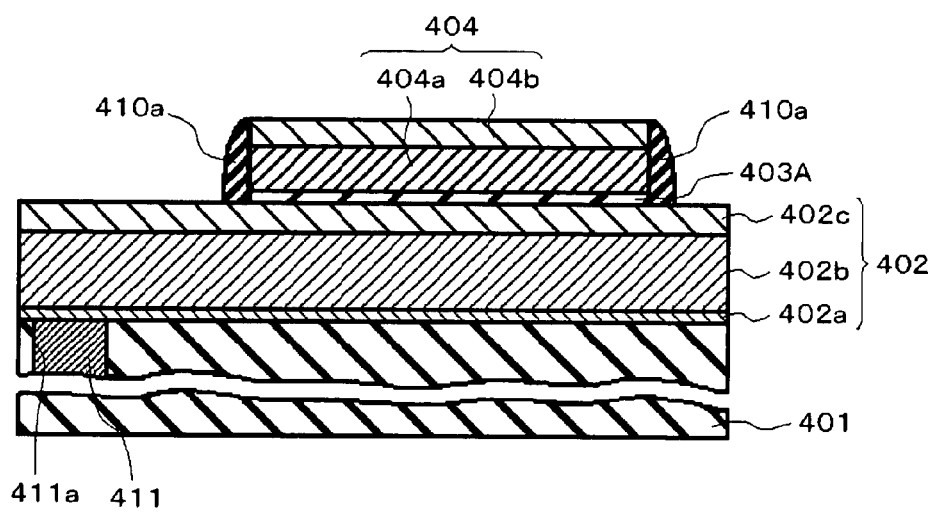

FIGS. 3A to 3C include second step sectional views schematically showing the manufacturing method of the semiconductor device according to the first example of the present invention;

FIGS. 4A to 4C include third step sectional views schematically showing the manufacturing method of the semiconductor device according to the first example of the present invention;

FIG. 5 is a partial plan view schematically showing a configuration of a reticle used in the manufacturing method of the semiconductor device according to the first example of the present invention;

FIG. 6 is a partial plan view schematically showing a configuration of a resist for forming an opening of a beaded shape used in the manufacturing method of the semiconductor device according to the first example of the present invention;

FIGS. 7A and 7B are a partial sectional view and a sectional view taken along the line X-X', respectively, which schematically show a configuration of a semiconductor device according to a second example of the present invention;

FIG. 8 is a partial plan view schematically showing a configuration of a resist for forming an opening of a slit shape used in a manufacturing method of the semiconductor device according to the second example of the present invention;

FIGS. 9A and 9B are a partial sectional view and a sectional view taken along the line X-X', respectively, which schematically show a configuration of a semiconductor device according to a third example of the present invention;

FIGS. 10A to 10C include first step sectional views schematically showing a manufacturing method of the semiconductor device according to the third example of the present invention;

FIGS. 11A to 11C include second step sectional views schematically showing the manufacturing method of the semiconductor device according to the third example of the present invention;

FIGS. 12A and 12B are a partial cross sectional view and a sectional view taken along the line X-X', respectively, which schematically show a configuration of a semiconductor device according to a fourth example of the present invention;

FIGS. 13A and 13B are a partial cross sectional view and a sectional view taken along the line X-X', respectively, which schematically show a configuration of a semiconductor device according to a fifth example of the present invention;

FIGS. 14A and 14B are a partial cross sectional view and a sectional view taken along the line X-X', respectively, which schematically show a configuration of a semiconductor device according to a sixth example of the present invention;

FIGS. 15A and 15B are a partial cross sectional view and a sectional view taken along the line X-X', respectively, which schematically show a configuration of a semiconductor device according to a seventh example of the present invention;

FIGS. 16A and 16B are a partial cross sectional view and a sectional view taken along the line X-X', respectively, which schematically show a configuration of a semiconductor device according to an eighth example of the present invention;

FIG. 17 is a partial plan view schematically showing a configuration of a semiconductor device according to a ninth example of the present invention;

FIG. 18 is a partial cross-sectional view taken along a line Y-Y' of FIG. 17 schematically showing the configuration of the semiconductor device according to the ninth example of the present invention;

FIG. 19 is an equivalent circuit diagram of one cell in the semiconductor device according to the ninth example of the present invention;

FIG. 20 is a partial cross sectional view schematically showing a configuration of a semiconductor device according to a first related art;

FIG. 21 is a partial cross sectional view schematically showing a configuration of a semiconductor device according to a second related art;

FIG. 22 is a partial cross sectional view schematically showing a configuration of a semiconductor device according to a third related art; and FIG. 23 is a partial cross sectional view schematically showing a configuration of a semiconductor device according to a fourth related art.

PREFERRED MODES OF THE INVENTION

In the following, preferred modes will be mentioned. A first mode is equivalent to the first aspect.

In a second mode, the two interconnects may be separated from each other and be formed in a same layer.

In a third mode, a metal layer may be provided under the contact plug.

In a fourth mode, the semiconductor device may further comprise: an MIM capacitor element formed of: one of the two interconnects; a dielectric film disposed on the one of the two interconnects; and an electrode disposed on the dielectric film.

In a fifth mode, ends of the dielectric film and the electrode may extend to the vicinity of a middle of a space between the two interconnects.

In a sixth mode, the MIM capacitor may be a capacitance between input and output interconnects of a flip-flop circuit forming an SRAM cell.

A seventh mode is equivalent to the second aspect.

An eighth mode, a method of manufacturing a semiconductor device is equivalent to the third aspect.

In the ninth mode, the method of manufacturing a semiconductor device may further comprise the steps of: forming a metal layer in a predetermine region on an insulating film; and forming an interlayer insulating film over the insulating film including the metal layer; the resist being applied after forming the interlayer insulating film.

In the tenth mode, the method of manufacturing a semiconductor device may further comprise the steps of: forming a second interlayer insulating film after forming the contact plug; and forming two openings separated from each other and leading to the contact plug in the second insulating film; the interconnects being formed in the two openings after forming the two openings.

In the eleventh mode, an MIM capacitor element may be formed on one of the two interconnects, the MIM capacitor element being formed by arranging an electrode on a dielectric film.

In the twelfth mode, a second pattern portion may be also formed for one or both of at least one other interconnect and a device when the pattern portion is formed; when the openings are formed, a second opening leading to the one or both of the at least one other interconnect and the device may be also formed; when the contact plug is formed, a second contact plug to be connected to the one or both of the at least one other interconnect and the device may be formed in the second opening; and when the interconnects are formed, a second interconnect may be also formed on the second contact plug.

FIRST EXAMPLE

A semiconductor device according to a first example of the present invention will be described, using drawings. FIGS. 1A and 1B are a partial sectional view and a sectional view taken along a line X-X', respectively, which schematically show a configuration of the semiconductor device according to the first example of the present invention.

In this semiconductor device, a contact plug 9c having a beaded shape is formed in a layer portion underlying an interconnect (wiring element) 11C and an interconnect (wiring element) 11D. The interconnect 11C and the interconnect 11D are electrically connected via a contact plug 9c.

In a device formation region of the semiconductor device on a semiconductor substrate 1 formed of a silicon substrate or the like, a gate electrode 4a made of polysilicon or the like is formed above the semiconductor substrate 1 that will become a channel, through a gate insulating film 3 made of a silicon oxide film or the like. On each side of the gate electrode 4a, a sidewall insulating film 5 made of a silicon oxide film formed into a sidewall shape is formed. On both sides of the channel, source/drain regions 6 formed by doping an impurity into the substrate 1 are formed, respectively. One of the source/drain regions 6 is electrically connected to a corresponding interconnect 11A (formed of a metal barrier layer 12*a* and an interconnect layer 13*a*) via a contact plug 9*a* formed of tungsten or the like, through an opening 8*a* formed in an interlayer insulating film 8 made of a silicon oxide film or the like. An impurity (such as boron) for contact may be doped into a contact between the source/drain region 6 and the contact plug 9*a*. A barrier metal film (not shown) made of titanium nitride or the like may be formed to a predetermined thickness, under the contact plug 9*a* and on sidewalls of the contact plug 9*a*.

In a device isolation region adjacent to the device formation region in the semiconductor device, a device isolation insulating film 2 made of a silicon oxide film or the like is formed in the semiconductor substrate 1. At a predetermined location on the device isolation insulating film, an interconnect 4*b* made of the same material (such as polysilicon) as the gate electrode 4*a* is formed. On both sides of the interconnect 4*b*, the sidewall insulating film 5 made of the silicon oxide film formed into the sidewall shape is formed. On the device isolation insulating film 2 including the interconnect 4*b*, an etching stopper insulating film 7 made of a silicon nitride film or the like is formed. The etching stopper insulating film 7 will become an etching stopper for the interlayer insulating film 8. The interconnect 4*b* is electrically connected to a corresponding interconnect 11B (constituted from a metal barrier layer 12*b* and an interconnect layer 13*b*) via a contact plug 9*b* made of tungsten or the like through an opening 8*b* formed in the interlayer insulating film 8 and the etching stopper insulating film 7. The impurity (such as boron) for contact may be preliminarily doped into a contact (interface) between the interconnect 4*b* and the contact plug 9*b*. A barrier metal film (not shown) made of titanium nitride or the like may be formed at a predetermined thickness, under the contact plug 9*b* and on sidewalls of the contact plug 9*b*.

In an area of the semiconductor device which does not interfere with the interconnect 4*b*, contact plug 9*b*, and interconnect 11B in the device isolation region, a contact plug 9*c* that electrically connects the interconnect 11C (constituted from a, metal barrier layer 12*c* and an interconnect layer 13*c*) and the interconnect 11D (constituted from a metal barrier layer 12*d* and an interconnect layer 13*d*) is formed. The contact plug 9*c* is made of tungsten or the like, and is formed in an opening 8*c* in the interlayer insulating film 8 on the device isolation insulating film 2. The etching stopper insulating film 7 may be interposed between the contact plug 9*c* and device isolation insulating film 2. The contact plug is formed so that a cross sectional shape thereof as seen in a direction of a normal to a principal surface of the substrate is a beaded shape in which a plurality (three or more) of beads are hooked (joined) together (refer to FIG. 1B). The barrier metal film (not shown) made of titanium nitride or the like may be formed at a predetermined thickness, under the contact plug 9*c* and on sidewalls of the contact plug 9*c*.

The interconnects 11A to 11D are formed in openings (not shown) in an interlayer insulating film 10 made of a silicon oxide film or the like in a same layer. The openings are separated from one another. The interconnect 11A has a configuration in which the interconnect layer 13*a* made of tungsten or the like is embedded in an opening in the interlayer insulating film 10 above the one of the source/drain regions 6, interposed with the metal barrier layer 12*a* made of titanium nitride or the like. The interconnect 11A is electrically connected to the one of the source/drain regions 6 via the contact plug 9*a*. The interconnect 11B has a configuration in which the interconnect layer 13*b* made of tungsten or the like is embedded in an opening in the interlayer insulating film 10 above the interconnect 4*b*, interposed with the metal barrier layer 12*b* made of titanium nitride or the like. The interconnect 11B is electrically connected to the interconnect 4*b* via the contact plug 9*b*. The interconnect 11C has a configuration in which the interconnect layer 13*c* made of tungsten or the like is embedded in an opening in the interlayer insulating film 10 above the etching stopper insulating film 7 including the contact plug 9*c*, interposed with the metal barrier layer 12*c* made of titanium nitride or the like. The interconnect 11D has a configuration in which the interconnect layer 13*d* made of tungsten or the like is embedded in an opening in the interlayer insulating film 10 above the etching stopper insulating film 7 including the contact plug 9*c*, interposed with the metal barrier layer 12*d* made of titanium nitride or the like. The interconnects 11C and 11D are electrically connected to the contact plug 9*c*. Though each of the interconnects 11A to 11D has the metal barrier layer under the interconnect layer thereof and on sidewalls of the interconnect layer thereof, the metal barrier layer may not be provided for each of the interconnects 11A to 11D.

Next, a manufacturing method of the semiconductor device according to the first example of the present invention will be described, using drawings. FIGS. 2A to 4C are cross sectional step views schematically showing the manufacturing method of the semiconductor device according to the first example of the present invention. FIG. 5 is partial plan view schematically showing a configuration of a reticle used in the manufacturing method of the semiconductor device according to the first example of the present invention. FIG. 6 is a partial plan view schematically showing a configuration of a resist for forming an opening of a beaded shape used in the manufacturing method of the semiconductor device according to the first example of the present invention.

First, a device isolation insulating film 2 is formed in a semiconductor substrate 1 (at step A1; refer to FIG. 2A) in a device isolation region. The device isolation insulating film can be formed by a selective oxidation method or the like using the silicon nitride film (not shown).

Figure 2A:
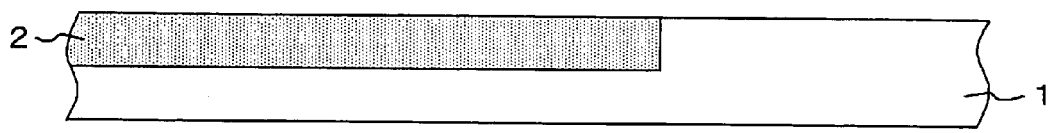
FIGS. 2A to 2C are first step sectional views schematically showing a manufacturing method of the semiconductor device according to the first example of the present invention.
Figure 2B:
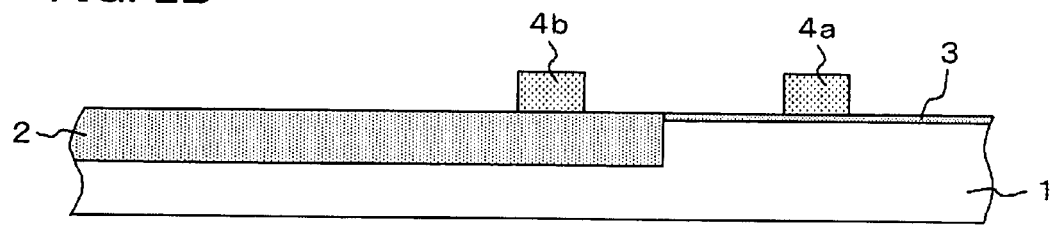

Next, after a gate insulating film 3 has been formed on the device formation region on the semiconductor substrate 1 by a thermal oxidation method or the like, a gate electrode 4*a* is formed on the gate insulating film 3, and an interconnect 4*b* is formed on the device isolation insulating film 2 (at step A2; refer to FIG. 2B). The gate insulating film 3 herein can be formed by the thermal oxidation method or the like. The gate electrode 4*a* and the interconnect 4*b* can be simultaneously formed by forming polysilicon (not shown) over an entire surface of the substrate with the gate insulating film 3 formed thereon, applying a resist (not shown) on polysilicon (not shown), performing exposure and development using a predetermined reticle to form pattern portions of the gate electrode 4*a* and the interconnect 4*b*, and selectively removing the polysilicon exposed except for the pattern portions using an etching technique.

Figure 2C:
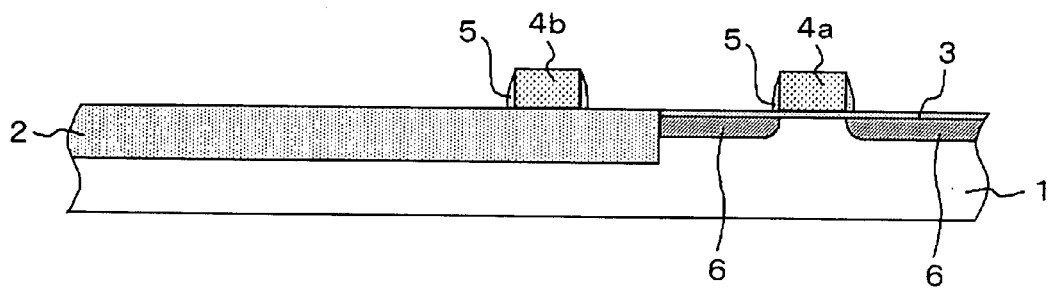

Next, after a sidewall insulating film 5 has been formed on both sides of the gate electrode 4*a*, impurity is doped into the semiconductor substrate 1 on both sides of the channel, thereby forming source/drain regions 6 (at step A3; refer to FIG. 2C). The sidewall insulating film 5 herein can be formed by forming a silicon oxide film (not shown) using a CVD method or the like and then performing etchback, and is formed on both sides of the interconnect 4*b* as well.

Next, after an etching stopper insulating film 7 has been formed on the device isolation insulating film 2 including the interconnect 4b, an interlayer insulating film 8 is formed over an entire surface of the substrate using the CVD method or the like (at step A4; refer to FIG. 3A). The etching stopper insulating film 7 herein can be formed by forming a silicon nitride film over an entire surface of the substrate, applying a resist (not shown) on the silicon nitride film, performing exposure and development using a predetermined reticle to form a pattern portion(s) of the etching stopper insulating film 7, and selectively removing the silicon nitride film that exposes from the pattern portion(s), using the etching technique. In view of use of a CMP (Chemical and Mechanical Polishing) method at step A7 and formation of openings 10a, 10b, 10c, and 10d at step A8, a stopper film (not shown; formed of a silicon nitride film, for example) may be formed after the interlayer insulating film 8 has been formed.

Next, a resist 21 is applied on the interlayer insulating film 8, and exposure and development are performed using the reticle (e.g., indicated by reference numeral 20 in FIG. 5), thereby forming pattern portions 21a, 21b, and 21c for openings (8a to 8c in FIG. 3C)(at step A5; refer to FIG. 3B). At this point, by performing exposure and development using the reticle (indicated by reference numeral 20 in FIG. 5) having three or more circular contact patterns (indicated by reference numeral 20a in FIG. 5) arranged at a pitch width (i.e., spacing) L narrower than a diameter R of each of the circular contact holes, the pattern portion 21c of the resist 21 is patterned into the beaded shape in which the respective circular contact holes are beaded together (refer to FIG. 6).

Next, the interlayer insulating film 8, gate insulating film 3, and etching stopper insulating film 7 exposed except for the pattern portions 21a, 21b, and 21c of the resist 21 are selectively removed, using the etching technique (at step A6; refer to FIG. 3C). This operation forms an opening 8a that leads to the source/drain region 6, an opening 8b that leads to the interconnect 4b, and an opening 8c that leads to the device isolation insulating film 2. Then, the resist 21 is removed.

Next, contact plugs 9a, 9b, and 9c are formed in the openings 8a, 8b, and 8c, respectively (at step A7; refer to FIG. 4A). The contact plugs 9a, 9b, and 9c herein can be formed by depositing on an entire surface of the substrate a metal layer (made of tungsten, for example) that will become the contact plugs 9a, 9b, and 9c at a predetermined thickness, using the CVD method or the like until the openings 8a, 8b, and 8c are completely buried, and removing and planarizing the metal layer by the CMP method until surfaces of the interlayer insulating film 8 come out.

Next, an interlayer insulating film 10 is formed over an entire surface of the substrate using the CVD method or the like. Then, openings 10a, 10b, 10c and 10d are formed in the interlayer insulating film 10 (at step A8; refer to FIG. 4B). The openings 10a, 10b, 10c, and 10d herein can be formed by applying a resist (not shown) on the interlayer insulating film 10, performing exposure and development using a predetermined reticle to form pattern portions of the openings 10a, 10b, 10c and 10d, and selectively removing the interlayer insulating film 10 exposed except for the pattern portions using the etching technique until surfaces of the contact plugs 9a, 9b, and 9c come out. In view of use of the CMP method at step A9, a stopper film (not shown; formed of a silicon nitride film, for example) may be formed after formation of the interlayer insulating film 10 and before formation of the openings 10a, 10b, 10c, and 10d.

Finally, interconnects 11A to 11D are formed in the openings 10a, 10b, 10c, and 10d, respectively (at step A9; refer to FIG. 4C). The interconnects 11A to 11D herein can be formed by forming titanium nitride which will become the metal barrier layers 12a, 12b, 12c, and 12d over an entire surface of the substrate, then depositing tungsten which will become the interconnect layers 13a, 13b, 13c, and 13d over an entire surface of the substrate to a predetermined thickness until tungsten is completely embedded in the openings 10a, 10b, 10c, and 10d, and then removing and planarizing tungsten and titanium nitride using the CMP method until surfaces of the interlayer insulating film 10 come out. By the steps described above, the semiconductor device with the contact plug 9c having the beaded shape formed in the layer portion underlying the interconnects 11C and 11D, and with the interconnects 11C and 11D electrically connected by the contact plug 9c can be formed.

According to the first example, the interconnects 11C and 11D are electrically connected together. It is therefore enough to form just two structures of the interconnects 11C and 11D and the contact plug 9c among interconnect elements. Accordingly, the number of manufacturing steps is reduced more than in conventional manufacturing methods and a layout which has an optimal interconnect structure in a layer overlaying the contact plugs can be implemented. Since the contact plug 9c with the beaded shape is formed simultaneously with the contact plugs 9a and 9b, which are discrete elements, there is an advantage that electrical connection between the interconnects can be made with lower resistance than in a conventional art.

Obviously, the semiconductor device according to the first example is different from a semiconductor device where a gate electrode 304 and a first active region 302a are connected by a first embedded layer 315 within a first contact hole 313 as shown in Patent Document 3 (refer to FIG. 22), in that the contact plug 9c having the beaded shape is formed in the layer portion underlying the interconnects 11C and 11d and the interconnects 11C and 11D are electrically connected by the contact plug 9c.

SECOND EXAMPLE

A semiconductor device according to a second example of the present invention will be described, using drawings. FIGS. 7A and 7B are a partial cross sectional view and a cross sectional view taken along the line X-X', respectively, which schematically show a configuration of the semiconductor device according to the second example of the present invention.

In the semiconductor device according to the second example, a contact plug 9d having a slit shape is formed in a layer portion underlying the interconnects 11C and 11D, and the interconnects 11C and 11D are electrically connected by the contact plug 9d. The configuration of the semiconductor device according to the second example is the same as that in the first example except an opening 8d and the contact plug 9d.

In a device isolation region that does not interfere with the interconnect 4b, contact plug 9b, and interconnect 11B in the semiconductor device, the contact plug 9d that electrically connects the interconnect 11C (constituted from the metal barrier layer 12c and the interconnect layer 13c) and the interconnect 11D (constituted from the metal barrier layer 12d and the interconnect layer 13d) is formed. The contact plug 9d is made of tungsten or the like, and is formed in a slit opening 8d in the interlayer insulating film 8 on the device isolation insulating film 2. An etching stopper insulating film 7 may be interposed between the contact plug 9d and the device isolation insulating film 2. The contact plug 9d is formed so that a sectional shape thereof as seen from the direction normal to the principal surface of the substrate is an elongate slit shape (refer to FIG. 7B). A barrier metal film (not shown) made of titanium nitride or the like may be formed at a predetermined thickness, under the contact plug 9d and on sidewalls of the contact plug 9d. The slit shape of the contact plug 9d means that the contact plug 9d has a substantially rectangular shape, the contact plug 9d tunnels in a layer underlying both of the two interconnects 11C and 11D, and an opening of the contact plug 9d as seen from above in a direction perpendicular to the substrate has the slit shape.

A manufacturing method of the semiconductor device according to the second example of the present invention will be described, using drawings. FIG. 8 is a partial plan view schematically showing a configuration of a resist for forming the opening of the slit shape used in the manufacturing method of the semiconductor device according to the second example of the present invention.

In the manufacturing method of the semiconductor device according to the second example, the pattern portion (indicated by reference numeral 21c in FIG. 3B) of the beaded shape of the resist (indicated by reference numeral 21 in FIG. 3B) at step A5 in the first example (refer to FIG. 3B) is formed into a pattern portion 21d of the slit shape as shown in FIG. 8, the opening of the beaded shape (indicated by reference numeral 8c in FIG. 3C) at step A6 in the first example (refer to FIG. 3C) is formed into the opening 8d of the slit shape as shown in FIG. 7B, and the contact plug of the beaded shape (indicated by reference numeral 9c in FIG. 4A) at step A7 in the first example (refer to FIG. 4A) is formed into the contact plug 9d of the slit shape as shown in FIG. 7B. Other steps in the manufacturing method of the semiconductor device according to the second example are the same as those in the first example.

A reticle for forming the pattern portion 21d of the slit shape in the manufacturing method of the semiconductor device according to the second example is similar to the reticle used at step A5 in the first example (refer to FIG. 3B). By optimization of an exposure time, the pattern portion 21d of the slit shape can be formed in the resist 21.

According to the second example, the interconnects 11C and 11D are electrically connected together. It is therefore enough to form just two structures of the interconnects 11C and 11D and the contact plug 9d among interconnect elements. Accordingly, a layout in which the number of manufacturing steps is reduced more than in the conventional manufacturing methods and which has an optimal interconnect structure in the layer overlaying the contact plugs can be implemented. Since the contact plug 9d with the slit shape is formed simultaneously with the contact plugs 9a and 9b, which are discrete elements, there is an advantage that electrical connection between the interconnects can be made with lower resistance than in the conventional art.

THIRD EXAMPLE

A semiconductor device according to a third example of the present invention will be described, using drawings. FIGS. 9A and 9B are a partial sectional view and a sectional view taken along the line X-X', respectively, which schematically show a configuration of the semiconductor device according to the third example of the present invention.

In the semiconductor device according to the third example, a contact plug 9c of the beaded shape is formed in the layer underlying the interconnects 11C and 11D. The interconnects 11C and 11D are connected together by the contact plug 9c. In the semiconductor device according to the third example, in place of the etching stopper insulating film (indicated by reference numeral 7 in FIG. 1A) in the first example, a metal layer 14 is formed just under and in the vicinity of the contact plug 9c. Other portions of the configuration of the semiconductor device according to the third example are the same as those in the first example.

In the device isolation region that does not interfere with the interconnect 4b, contact plug 9b, and interconnect 11B in the semiconductor device, the contact plug 9c that electrically connects the interconnect 11C (constituted from the metal barrier layer 12c and the interconnect layer 13c) and the interconnect 11D (constituted from the metal barrier layer 12d and the interconnect layer 13d) is formed. The metal layer 14 is formed between the contact plug 9c and the device isolation insulating film 2. The contact plug 9c is made of tungsten or the like, and is formed in the opening 8c in the interlayer insulating film 8 over the metal layer 14 that also serves as the etching stopper. The contact plug 9c is formed so that a cross sectional shape thereof as seen from the direction of the normal to the principal surface of the substrate has the beaded shape in which a plurality (three or more) beads are hooked or joined together (refer to FIG. 9B). A barrier metal film (not shown) made of titanium nitride or the like may be formed to a predetermined thickness under the contact plug 9c and on the sidewalls of the contact plug 9c.

Next, a manufacturing method of the semiconductor device according to the third example of the present invention will be described, using drawings. FIGS. 10A to 11C are cross sectional step views schematically showing the manufacturing method of the semiconductor device according to the third example of the present invention.

As in steps A1 to A3 in the first example (refer to FIGS. 2A to 2C), the device isolation insulating film 2 is first formed on a semiconductor substrate 1 in a device isolation region. Then, after a gate insulating film 3 has been formed in the device formation region on the semiconductor substrate 1, a gate electrode 4a is formed on the gate insulating film 3, and an interconnect 4b is formed on the device isolation insulating film 2. Then, after a sidewall insulating film 5 has been formed on both sides of the gate electrode 4a, impurity is doped into the semiconductor substrate 1 on both sides of the channel, thereby forming source/drain regions 6 (at step B1; refer to FIG. 10A).

Next, a metal layer 14 is formed on the device isolation insulating film (at step B2; refer to FIG. 10B). The metal layer 14 herein can be formed by forming a metal film on an entire surface of the substrate, applying a resist (not shown) on the metal film, performing exposure and development using a predetermined reticle to form a pattern portion of the metal film 14, and selectively removing the metal film exposed except for the pattern portion using the etching technique.

Next, after an interlayer insulating film 8 has been formed over an entire surface of the substrate, a resist 21 is applied on the interlayer insulating film 8, and exposure and development are performed using the reticle (indicated by reference numeral 20 in FIG. 5), thereby forming the pattern portions 21a, 21b, and 21c for the openings (indicated by reference numerals 8a to 8c in FIG. 11A)(at step B3; refer to FIG. 10C). In view of use of the CMP (Chemical and Mechanical Polishing) method at step B5 and formation of the openings in the interlayer insulating film 10 at step B6, the stopper film (not shown; formed of the silicon nitride film, for example) may be formed after the interlayer insulating film 8 has been formed and before formation of the resist 21. By performing exposure and development using the reticle (indicated by reference numeral 20 in FIG. 5) having three or more circular contact patterns (indicated by reference numeral 20a in FIG. 5) arranged at the pitch width (spacing size) L narrower than the diameter R of each of the circular contact holes, a pattern portion 21c of the resist 21 is patterned into the beaded shape in which respective circular contact holes are beaded together (refer to FIG. 6).

Next, the interlayer insulating film 8 and the gate insulating film 3 exposed except for the pattern portions 21a, 21b, and 21c of the resist 21 are selectively removed using the etching technique (at step B4; refer to FIG. 11A). This operation forms the opening 8a that leads to the source/drain region 6, the opening 8b that leads to the interconnect 4b, and the opening 8c that leads to the metal layer 14. Then, the resist 21 is removed.

Next, the contact plugs 9a, 9b, and 9c are formed in the openings 8a, 8b, and 8c, respectively (at step B5; refer to FIG. 11B). The contact plugs 9a, 9b, and 9c herein can be formed by depositing the metal layer (made of tungsten, for example) that will become the contact plugs 9a, 9b, and 9c to a predetermined thickness until the openings 8a, 8b, and 8c are completely buried, using the CVD method or the like, and removing and planarizing the metal layer using the CMP method until the surfaces of the interlayer insulating film 8 come out.

Finally, as in steps A8 to A9 in the first example (refer to FIGS. 4B to 4C), an interlayer insulating film 10 is formed over the entire surface of the substrate. Then, openings are formed in the interlayer insulating film 10, and then the interconnects 11A to 11D are formed in the openings of the interlayer insulating film 10 (at step B6; refer to FIG. 11C). By the steps described above, the semiconductor device with the contact plug 9c having the beaded shape formed in the layer underlying the interconnects 11C and 11D, and the interconnects 11C and 11D are electrically connected by the contact plug 9c can be formed.

The third example has an effect similar to that in the first example.

FOURTH EXAMPLE

A semiconductor device according to a fourth example of the present invention will be described, using drawings. FIGS. 12A and 12B are a partial cross sectional view and a cross sectional view taken along the line X-X', respectively, which schematically show a configuration of the semiconductor device according to the fourth example of the present invention.

In the semiconductor device according to the fourth example, a contact plug 9d having a slit shape is formed in a layer underlying interconnects 11C and 11D, and the interconnects 11C and 11D are electrically connected together by the contact plug 9d. In the semiconductor device according to the fourth example, in place of the etching stopper insulating film (indicated by reference numeral 7 in FIG. 7A) in the second example, a metal layer 14 is formed just under and in the vicinity of the contact plug 9c. Other portions of the configuration of the semiconductor device according to the fourth example is the same as those in the second example.

In the device isolation region that does not interfere with the interconnect 4b, contact plug 9b, and interconnect 11B in the semiconductor device, a contact plug 9d that electrically connects the interconnect 11C (constituted from the metal barrier layer 12c and the interconnect layer 13c) and the interconnect 11D (constituted from the metal barrier layer 12d and the interconnect layer 13d) is formed. A metal layer 14 is formed between the contact plug 9d and the device isolation insulating film 2. The contact plug 9d is made of tungsten or the like, and is formed in the opening 8d in the interlayer insulating film 8 above the metal layer 14. The contact plug 9d is formed so that a cross sectional shape thereof as seen from the direction normal to the principal surface of the substrate is an elongate slit shape (refer to FIG. 12B). A barrier metal film (not shown) made of titanium nitride or the like may be formed to a predetermined thickness under the contact plug 9d and on the sidewalls of the contact plug 9d.

Next, a manufacturing method of the semiconductor device according to the fourth example of the present invention will be described.

In the manufacturing method of the semiconductor device according to the fourth example, the pattern portion (indicated by reference numeral 21c in FIG. 11A) of the beaded shape of the resist (indicated by reference numeral 21 in FIG. 11A) at step B4 in the third example (refer to FIG. 11A) is formed into the pattern portion 21d of the slit shape as shown in FIG. 8, the opening of the beaded shape (indicated by reference numeral 8c in FIG. 9B) at step B4 in the third example (refer to FIG. 11A) is formed into the opening 8d of the slit shape as shown in FIG. 12B, and the contact plug of the beaded shape (indicated by reference numeral 9c in FIG. 9B) at step B5 in the third example (refer to FIG. 11B) is formed into the contact plug 9d of the slit shape as shown in FIG. 7B (refer to FIGS. 12A and 12B). Other steps in the manufacturing method of the semiconductor device according to the fourth example are the same as those in the third example.

The fourth example has an effect similar to that in the second example.

FIFTH EXAMPLE

A semiconductor device according to a fifth example of the present invention will be described, using drawings. FIGS. 13A and 13B are a partial cross sectional view and a cross sectional view taken along the line X-X', which schematically show a configuration of the semiconductor device according to the fifth example of the present invention.

The semiconductor device according to the fifth example is obtained by forming an MIM capacitor element constituted from an interconnect 11D, a dielectric film 16, and an electrode 17 in the semiconductor device according to the first example. In the MIM capacitor element, the dielectric film 16 made of tantalum oxide or the like is formed on the interconnect 11D which will become an electrode, and the electrode 17 (formed of a metal barrier layer 18 and a metal layer 19) is formed on the dielectric film 16. Ends of the dielectric film 16 and the electrode 17 extend to the vicinity of the middle of a space between the interconnect 11C and the interconnect 11D. The electrode 17 has a configuration in which the metal layer 19 made of tungsten or the like is laminated on the metal barrier layer 18 made of titanium nitride or the like. Over the interlayer insulating film 10 including a region for the MIM capacitor element and interconnects 11A, 11B, and 11C, an insulating film 15 is formed. Though the electrode 17 has the metal barrier layer 18 under the metal layer 19, it may be so arranged that the electrode 17 does not have the metal barrier layer 18.

In a manufacturing method of the semiconductor device according to the fifth example, after step A9 in the first example (refer to FIG. 4C), the dielectric film 16, metal barrier layer 18, and metal layer 19 are laminated in this stated order. Then, a resist (not shown) is formed in a predetermined location of the metal layer 19. Then, with the resist (not shown) used as a mask, the metal layer 19, metal barrier layer 18, and dielectric film 16 are etched and removed. Then, after the resist has been removed, the insulating film 15 is formed.

When an MIM capacitor element constituted from a lower metal layer 402, a dielectric layer 403A, and an upper metal layer 404 is formed as in Patent Document 4 (refer to FIG. 23), electric field concentration may occur along interfaces of the dielectric layer 403A with the ends of the upper metal layer 404 and the lower metal layer 402 that sandwich the dielectric layer 403A, thereby causing deterioration in breakdown voltage. In order to prevent this phenomenon, it is necessary to form a sidewall 410a on respective sides of the upper metal layer 404 and the dielectric layer 403A, or to locally provide an insulating film between an end of the dielectric layer 403A and an end of the upper metal layer 404 or between the end of the dielectric layer 403A and an end of the lower metal layer 402. Thus, a problem arises that the number of manufacturing steps increases. Further, when the lower metal layer 402 is to be connected to another interconnect using a conventional art, a diffusion layer or a gate electrode will be used. Interconnect (wiring) resistance for the connection will be thereby increased. On the other hand, when an interconnect body with low resistance is added, the number of manufacturing steps for the addition will increase. In view of these respects, it is not necessary to form the sidewalls or the local insulating film when the MIM capacitor element is formed, in the fifth example. Accordingly, the number of manufacturing steps can be reduced.

SIXTH EXAMPLE

A semiconductor device according to a sixth example of the present invention will be described, using drawings. FIGS. 14A and 14B are a partial sectional view and a sectional view taken along the line X-X', which schematically show a configuration of the semiconductor device according to the sixth example of the present invention.

The semiconductor device according to the sixth example is obtained by forming the MIM capacitor element constituted from the interconnect 11D, dielectric film 16, and electrode 17 in the semiconductor device according to the second example. In the MIM capacitor element, the dielectric film 16 made of tantalum oxide or the like is formed on the interconnect 11D which will become an electrode, and an electrode 17 (formed of a metal barrier layer 18 and a metal layer 19) is formed on the dielectric film 16. The ends of the dielectric film 16 and the electrode 17 extend to about the middle of the space between the interconnect 11C and the interconnect 11D on the interlayer insulating film 10. The electrode 17 has a configuration in which the metal layer 19 made of tungsten or the like is laminated on the metal barrier layer 18 made of titanium nitride or the like. Over the interlayer insulating film 10 including the MIM capacitor element region and the interconnects 11A, 11B, and 11C, the insulating film 15 is formed. Though the electrode 17 has the metal barrier layer 18 under the metal layer 19, it may be so arranged that the electrode 17 does not have the metal barrier layer 18. A step of forming the MIM capacitor element in the manufacturing method of the semiconductor device according to the sixth example is the same as that in the fifth example.

The sixth example has an effect similar to that of the fifth example.

SEVENTH EXAMPLE

A semiconductor device according to a seventh example of the present invention will be described, using drawings. FIGS. 15A and 15B are a partial cross sectional view and a cross sectional view taken along the line X-X', which schematically show a configuration of the semiconductor device according to the seventh example of the present invention.

The semiconductor device according to the seventh example is obtained by forming the MIM capacitor element constituted from the interconnect 11D, dielectric film 16, and electrode 17 in the semiconductor device according to the third example. In the MIM capacitor element, the dielectric film 16 made of tantalum oxide or the like is formed on the interconnect 11D which will become an electrode, and the electrode 17 (formed of a metal barrier layer 18 and a metal layer 19) is formed on the dielectric film 16. The ends of the dielectric film 16 and the electrode 17 extend to about the middle of the space between the interconnect 11C and the interconnect 11D on the interlayer insulating film 10. The electrode 17 has a configuration in which the metal layer 19 made of tungsten or the like is laminated on the metal barrier layer 18 made of titanium nitride or the like. Over the interlayer insulating film 10 including the MIM capacitor element region and the interconnects 11A, 11B, and 11C, the insulating film 15 is formed. Though the electrode 17 has the metal barrier layer 18 under the metal layer 19, it may be so arranged that the electrode 17 does not have the metal barrier layer 18. A step of forming the MIM capacitor element in a manufacturing method of the semiconductor device according to the seventh example is the same as that in the fifth example.

The seventh example has an effect similar to that of the fifth example.

EIGHTH EXAMPLE

A semiconductor device according to an eighth example of the present invention will be described, using drawings. FIGS. 16A and 16B are a partial cross sectional view and a cross sectional view taken along the line X-X', which schematically show a configuration of the semiconductor device according to the eighth example of the present invention.

The semiconductor device according to the eighth example is obtained by forming the MIM capacitor element constituted from the interconnect 11D, dielectric film 16, and electrode 17 in the semiconductor device according to the fourth example. In the MIM capacitor element, the dielectric film 16 made of tantalum oxide or the like is formed on the interconnect 11D that will become the electrode, and the electrode 17 (formed of the metal barrier layer 18 and the metal layer 19) is formed on the dielectric film 16. The ends of the dielectric film 16 and the electrode 17 extend to about the middle of the space between the interconnect 11C and the interconnect 11D on the interlayer insulating film 10. The electrode 17 has the configuration in which the metal layer 19 made of tungsten or the like is laminated on the metal barrier layer 18 made of titanium nitride or the like. Over the interlayer insulating film 10 including the MIM capacitor element region and the interconnects 11A, 11B, and 11C, the insulating film 15 is formed. Though the electrode 17 has the metal barrier layer 18 under the metal layer 19, it may be so arranged that the electrode 17 does not have the metal barrier layer 18. A step of forming the MIM capacitor element in a manufacturing method of the semiconductor device according to the eighth example is the same as that in the fifth example.

The eighth example has an effect similar to that of the fifth example.

NINTH EXAMPLE

A semiconductor device according to a ninth example of the present invention will be described, using drawings. FIG. 17 is a partial plan view schematically showing a configuration of the semiconductor device according to the ninth example of the present invention. FIG. 18 is a partial sectional view taken along a line Y-Y' in FIG. 17 schematically showing the configuration of the semiconductor device according to the ninth example of the present invention. FIG. 19 is an equivalent circuit of one cell in the semiconductor device according to the ninth example of the present invention.

In the ninth example, the contact plug (indicated by reference numeral 9c in FIGS. 1A and 1B) of the beaded shape in the semiconductor device according to the first example is applied to connection to an SRAM cell power supply hanging portion. In an SRAM cell, a capacitance (MIM capacitor element) is included between flip-flop input and output interconnects (wiring elements) in the cell, in order to cope with a soft error rate (SER). In view of variations in the capacitance, it is preferable to form an electrode that will become a capacitance plate to be as flat as possible, in the MIM capacitor element. For this reason, in the SRAM cell, a power supply line for a cell transistor is lead in below a channel.

Referring to FIGS. 17 and 18, a plurality of cells C are disposed in row and column directions in this semiconductor device. In each cell C, MOS transistors T1 to T6 are disposed. In each of the MOS transistors T1 to T6, polysilicon 4a which will become a gate electrode is formed above a channel through a gate insulating film (not shown), and impurity diffusion regions 6 which will become source/drain regions are formed on both sides of the channel. The polysilicon 4a that will become the gate electrode of the MOS transistor T1 is formed to be integral with the gate electrode of the MOS transistor T3, and is electrically connected to an impurity diffusion region 6 which is common between the MOS transistor T4 and the MOS transistor T6 and a noncommon impurity diffusion region 6 of the MOS transistor T2, through the contact plugs 9a and the interconnects 11A (each formed of the metal barrier layer 12a and the interconnect layer 13a). The polysilicon 4a that will become the gate electrode of the MOS transistor T2 is formed to be integral with the gate electrode of the MOS transistor T4, and is electrically connected to an impurity diffusion region 6 which is common between the MOS transistor T3 and the MOS transistor T5 and a noncommon impurity diffusion region 6 of the MOS transistor T1, through the contact plugs 9a and the interconnect 11A. An impurity diffusion region 6 which is common between the MOS transistor T1 and the MOS transistor T2 is electrically connected to a power supply VCC through the contact plug 9a, interconnect 11D (formed of the metal barrier layer 12d and the interconnect layer 13d), contact plug 9c, and interconnect 11C (formed of the metal barrier layer 12c and the interconnect layer 13c). An impurity diffusion region 6 which is common between the MOS transistor T3 and the MOS transistor T4 is electrically connected to a ground GND through the contact plug 9a and the interconnect 11A. The polysilicon 4a that will become the gate electrode of the MOS transistor T5 is formed to be integral with the gate electrode of the MOS transistor T6, and will become a word line W. A noncommon impurity diffusion region 6 of the MOS transistor T5 is electrically connected to a digit line D1. A noncommon impurity diffusion region 6 of the MOS transistor T6 is electrically connected to a digit line D2. The interconnects 11A, 11C, and 11D are disposed in a layer above the polysilicon 4a and the impurity diffusion regions 6. Above each of the interconnects 11A and 11D, the electrode 17 (formed of the metal barrier layer 18 and the metal layer 19) is disposed interposed with the dielectric film 16. The dielectric film 16 and the electrode 17 include an opening 17a, i.e., where no dielectric film 16 and no electrode 17 exist, in a region in which the interconnect 11C is disposed. The interconnect 11A, dielectric film 16, and electrode 17 form the MIM capacitor element, while the interconnect 11D, dielectric film 16, and electrode 17 form the MIM capacitor element. A side surface of the opening 17a for the dielectric film 16 and the electrode 17 extents from a side of the interconnect 11C to about the middle of a space between the interconnects 11C and 11D. In a layer underlying the interconnects 11C and 11D, the contact plug 9c of the beaded shape which provides an embedded interconnect is formed from a first region with the dielectric film 16 and the electrode 17 disposed therein to the power supply hanging portion with the interconnect 11C disposed therein. The contact plug 9c electrically connects the interconnects 11C and 11D. The equivalent circuit of one cell in the semiconductor device in FIG. 17 becomes the one as shown in FIG. 19.

The ninth example has an effect similar to that in the fifth example.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. A semiconductor device, comprising:
   a first region with Static Random Access Memory (SRAM) cells formed on a substrate thereof;
   a power supply hanging portion provided for a predetermined number of said SRAM cells;
   a second region between said first region and said power supply hanging portion; and
   an embedded interconnect, which electrically connects said first region to said power supply hanging portion, being continuous from said first region to said power supply hanging portion,
   said first region, said second region, and said supply power hanging portion being continuous and sequentially disposed in a direction horizontal to said substrate.

2. A semiconductor device, comprising:
   a contact plug formed into a beaded shape or a slit shape in a layer underlying two interconnects, said contact plug electrically connecting said two interconnects; and
   a metal-insulator-metal (MIM) capacitor element, said MIM capacitor element comprising:
      one of said two interconnects;

a dielectric film disposed on said one of said two interconnects; and an electrode disposed on said dielectric film, wherein said dielectric film is disposed only on said one of said two interconnects, entirely in an upper layer of said interconnects, and wherein said electrode is disposed in a different layer than said other one of said two interconnects.

3. The semiconductor device according to claim 1, wherein said embedded interconnect is disposed entirely below, and is in direct contact with, said first region, said second region, and said power supply hanging portion.

4. The semiconductor device according to claim 1, wherein said first region comprises a metal-insulator-metal (MIM) capacitor element, said MIM capacitor element comprising:

an interconnect;

a dielectric film disposed on said interconnect; and an electrode disposed on said dielectric film, said electrode comprising a metal barrier layer and a metal layer, said metal layer being disposed on a surface of said metal barrier layer.

5. The semiconductor device according to claim 4, wherein ends of said dielectric film and said electrode extend up to a vicinity of a middle section of said second region.

* * * * *